US012487534B2

(12) United States Patent
Tu et al.

(10) Patent No.: US 12,487,534 B2
(45) Date of Patent: Dec. 2, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Shih-Yu Tu, Zhubei (TW); Chieh Hsieh, Taoyuan (TW); Shang-Chieh Chien, New Taipei (TW); Sheng-Kang Yu, Hsinchu (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 895 days.

(21) Appl. No.: 17/659,256

(22) Filed: Apr. 14, 2022

(65) Prior Publication Data

US 2022/0413399 A1 Dec. 29, 2022

Related U.S. Application Data

(60) Provisional application No. 63/214,598, filed on Jun. 24, 2021.

(51) Int. Cl.
*G03F 7/20* (2006.01)
*G03F 7/00* (2006.01)

(52) U.S. Cl.
CPC ...... *G03F 7/70916* (2013.01); *G03F 7/70033* (2013.01); *G03F 7/70925* (2013.01)

(58) Field of Classification Search
CPC ............ G03F 7/70916; G03F 7/70033; G03F 7/70925; G03F 7/7095; G03F 7/70958
See application file for complete search history.

(56) References Cited

U.S. PATENT DOCUMENTS

| 7,129,009 B2* | 10/2006 | French | C08K 5/06 428/522 |
| 2011/0048452 A1* | 3/2011 | Zink | B08B 7/00 134/1 |
| 2013/0306110 A1* | 11/2013 | De Dea | B08B 11/02 134/26 |

* cited by examiner

*Primary Examiner* — Mesfin T Asfaw
(74) *Attorney, Agent, or Firm* — Harrity & Harrity, LLP

(57) ABSTRACT

A coating is included on one or more components of a lithography system. The coating reduces surface roughness of the one or more surfaces, increases flatness of the one or more surfaces, and/or increases uniformity of the one or more surfaces. The coating may be formed on the one or more surfaces using one or more of the techniques described herein. The coating is configured to reduce adhesion of target material particles to the one or more surfaces, is configured to resist buildup of target material particles on the one or more surfaces, is configured to provide resistance against oxidation of the one or more surfaces, is configured to resist thermal damage of the one or more surfaces, and/or is configured to enable the lithography system to operate at higher operating temperatures, among other examples.

20 Claims, 26 Drawing Sheets

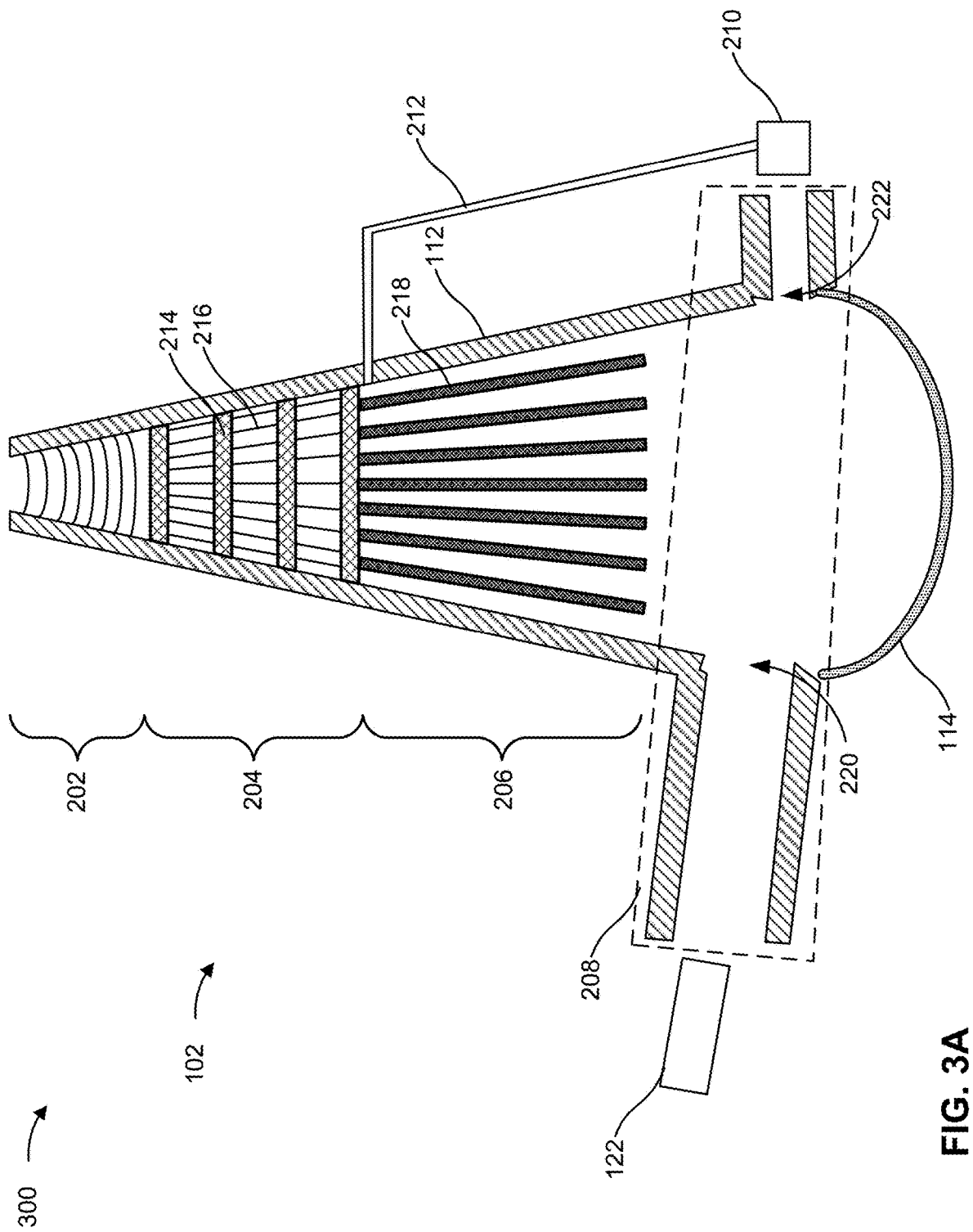

SEMICONDUCTOR PROCESSING TOOL AND METHODS OF OPERATION

CROSS-REFERENCE TO RELATED APPLICATION

This patent application claims priority to U.S. Provisional Patent Application No. 63/214,598, filed on Jun. 24, 2021, and entitled "SEMICONDUCTOR PROCESSING TOOL AND METHODS OF OPERATION." The disclosure of the prior application is considered part of and is incorporated by reference into this patent application.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E, 4, and 5 are diagrams of example implementations described herein.

DETAILED DESCRIPTION

Figure 1:
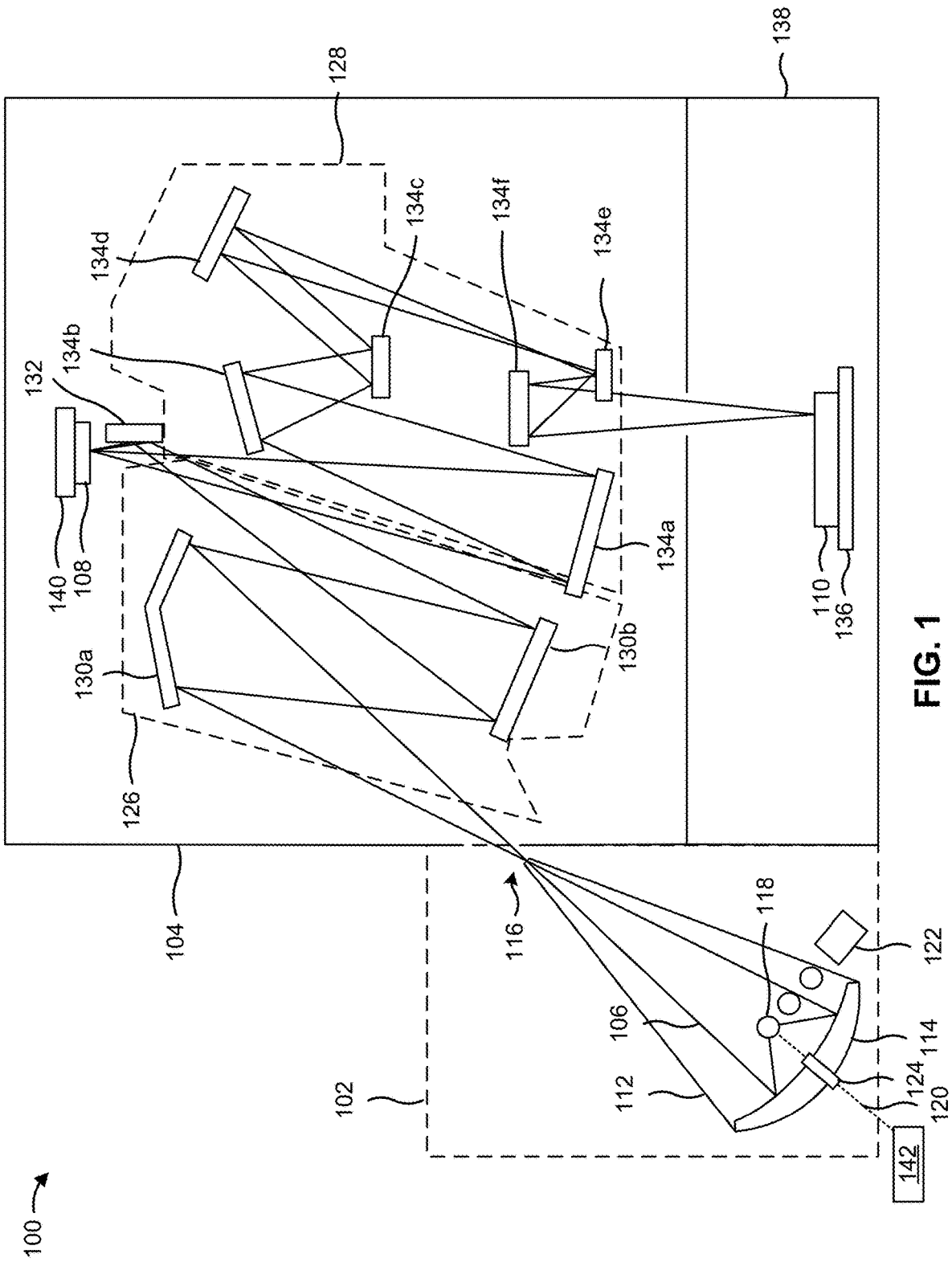
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more components of a lithography system (e.g., an extreme ultraviolet (EUV) lithography system) may be removed from operational service from time to time to clean and maintain the one or more components. In particular, the lithography system may be taken offline and disassembled to remove buildups of target material (e.g., tin (Sn) and/or another type of target material) and contamination from the one or more components to restore the operational efficiency of the lithography system and/or to reduce the likelihood of reticle and/or semiconductor substrate contamination from the target material. Then, the lithography system is reassembled and recalibrated so that the lithography system can be placed back into operational service.

Cleaning, maintenance, disassembly, reassembly, and recalibration of a lithography system (or one or more components thereof) due to target material buildup and contamination may result in a loss of productivity for the lithography system (e.g., a loss of several days or more of productivity, a loss of approximately 5% or more of production time for the lithography system). Moreover, the target material buildup may reduce the operating efficiency of the lithography system by blocking or absorbing a portion of radiation that is to be transferred from a radiation source (e.g., an EUV source) to an exposure tool (e.g., an EUV scanner) associated with the radiation source. Particles of a target material buildup can also break off (or may be forced off due to tin spitting), which may result in the particles landing on (and contaminating) a collector of the radiation source, and/or can result in the particles being transferred to the exposure tool where mirrors, a wafer stage, and/or a reticle may be contaminated by the particles.

Some implementations described herein provide a coating that is included on one or more components of a lithography system such as an EUV lithography system. The coating includes a nanoscale coating or another type of coating that is formed on one or more surfaces (e.g., one or more bare metal surfaces, one or more mirror surfaces, and/or another type of surface) of the one or more components. The coating reduces surface roughness of the one or more surfaces, increases flatness of the one or more surfaces, and/or increases uniformity of the one or more surfaces. The coating may be formed on the one or more surfaces using one or more of the techniques described herein.

In this way, the coating is configured to reduce adhesion of target material particles (e.g., tin (Sn) particles and/or another type of target material particles) to the one or more surfaces, is configured to resist buildup of target material particles on the one or more surfaces, is configured to provide resistance against oxidation of the one or more surfaces, is configured to resist thermal damage of the one or more surfaces, and/or is configured to enable the lithography system to operate at higher operating temperatures (e.g., relative to without the coating), among other examples. This reduces target material contamination in the lithography system and reduces target material buildup, target material clogging, and/or target material transfer between subsystems of the lithography system. Moreover, this increases semiconductor processing yield for the lithography system, reduces defects for the semiconductor processing yield, increases the time duration between cleaning operations for the one or more components of the lithography system (which reduces downtime and increases productivity for the lithography system), and/or reduces maintenance complexity for the lithography system, among other examples.

FIG. 1 is a diagram of an example lithography system 100 described herein. The lithography system 100 includes an extreme ultraviolet (EUV) lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner tool, and EUV exposure tool, or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 of a target material (e.g., droplets of a target material including Sn droplets or another type of droplets) of a target material being exposed to a laser beam 120. The droplets 118 are provided across the front of the collector 114 by a droplet generator (DG) 122. The droplet generator 122 is pressurized to provide a fine and controlled output of the droplets 118. The laser beam 120 is provided such that the laser beam 120 is focused through a window 124 of the collector 114. The laser beam 120 is focused onto the droplets 118 which generates the plasma. The plasma produces a plasma emission, some of which is the radiation 106.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a wafer stage 136 (or a substrate stage) configured to support the semiconductor substrate 110. Moreover, the wafer stage 136 is configured to move (or step) the semiconductor substrate 110 through a plurality of exposure fields as the radiation 106 transfers the pattern from the reticle 108 onto the semiconductor substrate 110. The wafer stage 136 is included in a bottom module 138 of the exposure tool 104. The bottom module 138 includes a removable subsystem of the exposure tool 104. The bottom module 138 may slide out of the exposure tool 104 and/or otherwise may be removed from the exposure tool 104 to enable cleaning and inspection of the wafer stage 136 and/or the components of the wafer stage 136. The bottom module 138 isolates the wafer stage 136 from other areas in the exposure tool 104 to reduce and/or minimize contamination of the semiconductor substrate 110. Moreover, the bottom module 138 may provide physical isolation for the wafer stage 136 by reducing the transfer of vibrations (e.g., vibrations in the semiconductor processing environment in which the lithography system 100 is located, vibrations in the lithography system 100 during operation of the lithography system 100) to the wafer stage 136 and, therefore, the semiconductor substrate 110. This reduces movement and/or disturbance of the semiconductor substrate 110, which reduces the likelihood that the vibrations may cause a pattern misalignment.

The exposure tool 104 also includes a reticle stage 140 that is configured to support and/or secure the reticle 108. Moreover, the reticle stage 140 is configured to move or slide the reticle through the radiation 106 such that the reticle 108 is scanned by the radiation 106. In this way, a pattern that is larger than the field or beam of the radiation 106 may be transferred to the semiconductor substrate 110.

The lithography system 100 includes a laser source 142. The laser source 142 is configured to generate the laser beam 120. The laser source 142 may include a $CO_2$-based laser source or another type of laser source. Due to the wavelength of the laser beams generated by a $CO_2$-based laser source in an infrared (IR) region, the laser beams may be highly absorbed by tin, which enables the $CO_2$-based laser source to achieve high power and energy for pumping tin-based plasma. In some implementations, the laser beam 120 includes a plurality of types of laser beams that the laser source 142 generates using a multi-pulse technique (or a multi-stage pumping technique), in which the laser source 142 generates a pre-pulse laser beam and main-pulse laser beam to achieve greater heating efficiency of tin (Sn)-based plasma to increase conversion efficiency.

In an example exposure operation (e.g., an EUV exposure operation), the droplet generator 122 provides the stream of the droplets 118 across the front of the collector 114. The laser beam 120 contacts the droplets 118, which causes a plasma to be generated. The laser source 142 generates and provides a pre-pulse laser beam toward a target material droplet in the stream of the droplets 118, and the pre-pulse laser beam is absorbed by the target material droplet. This transforms the target material droplet into disc shape or a mist. Subsequently, the laser source 142 provides a main-pulse laser beam with large intensity and energy toward the disc-shaped target material or target material mist. Here, the atoms of the target material are neutralized, and ions are generated through thermal flux and shock wave. The main-pulse laser beam pumps ions to a higher charge state, which causes the ions to radiate the radiation 106 (e.g., EUV light).

The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 06 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2A:
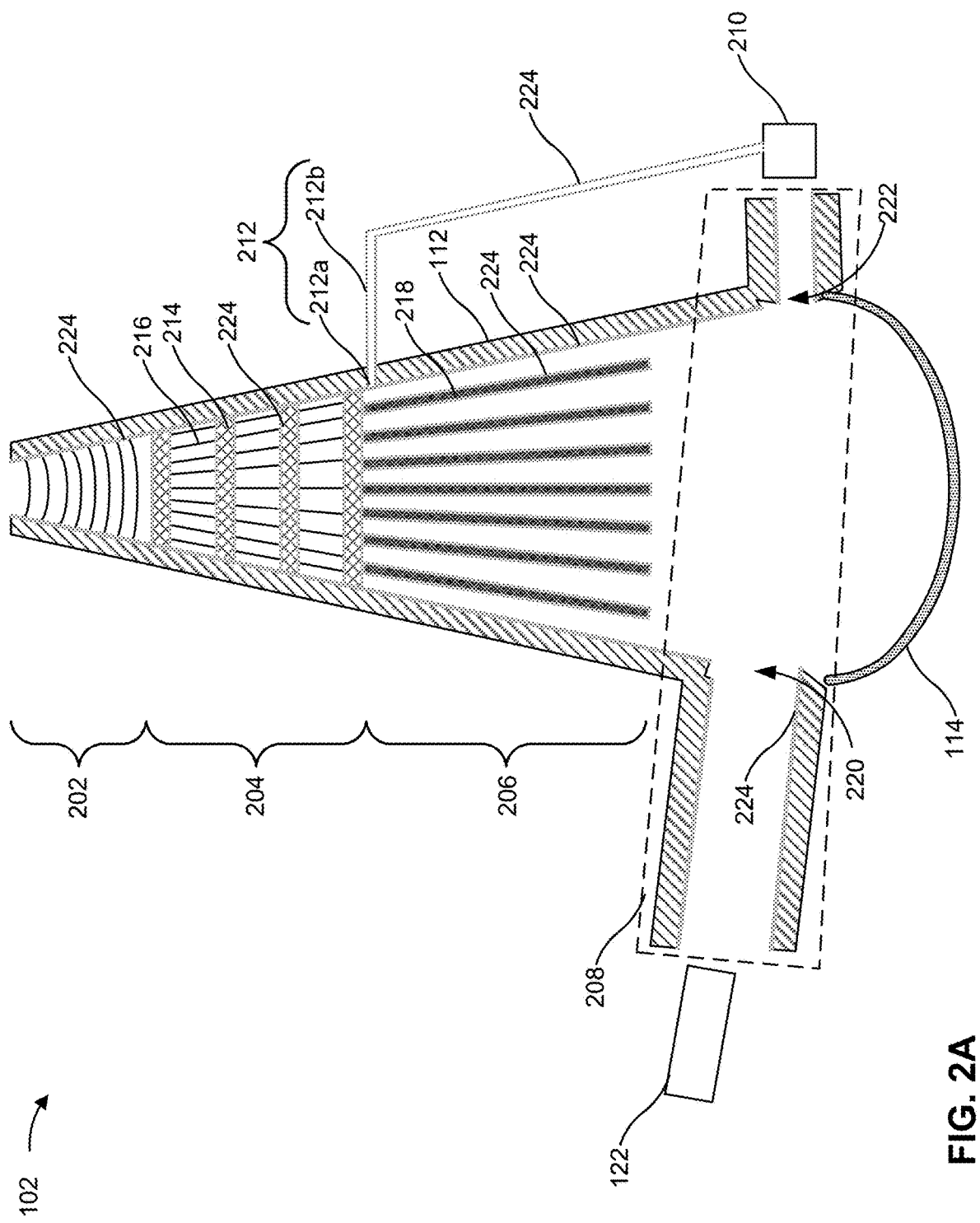
FIGS. 2A-2C are diagrams of an example radiation source described herein for use in the lithography system of FIG. 1.
Figure 2B:
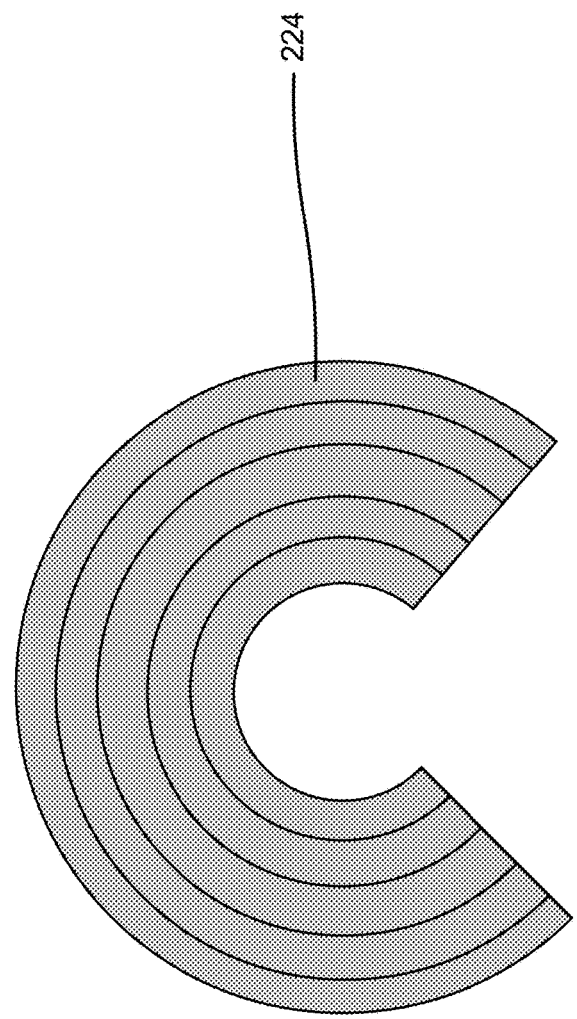
Figure 2C:
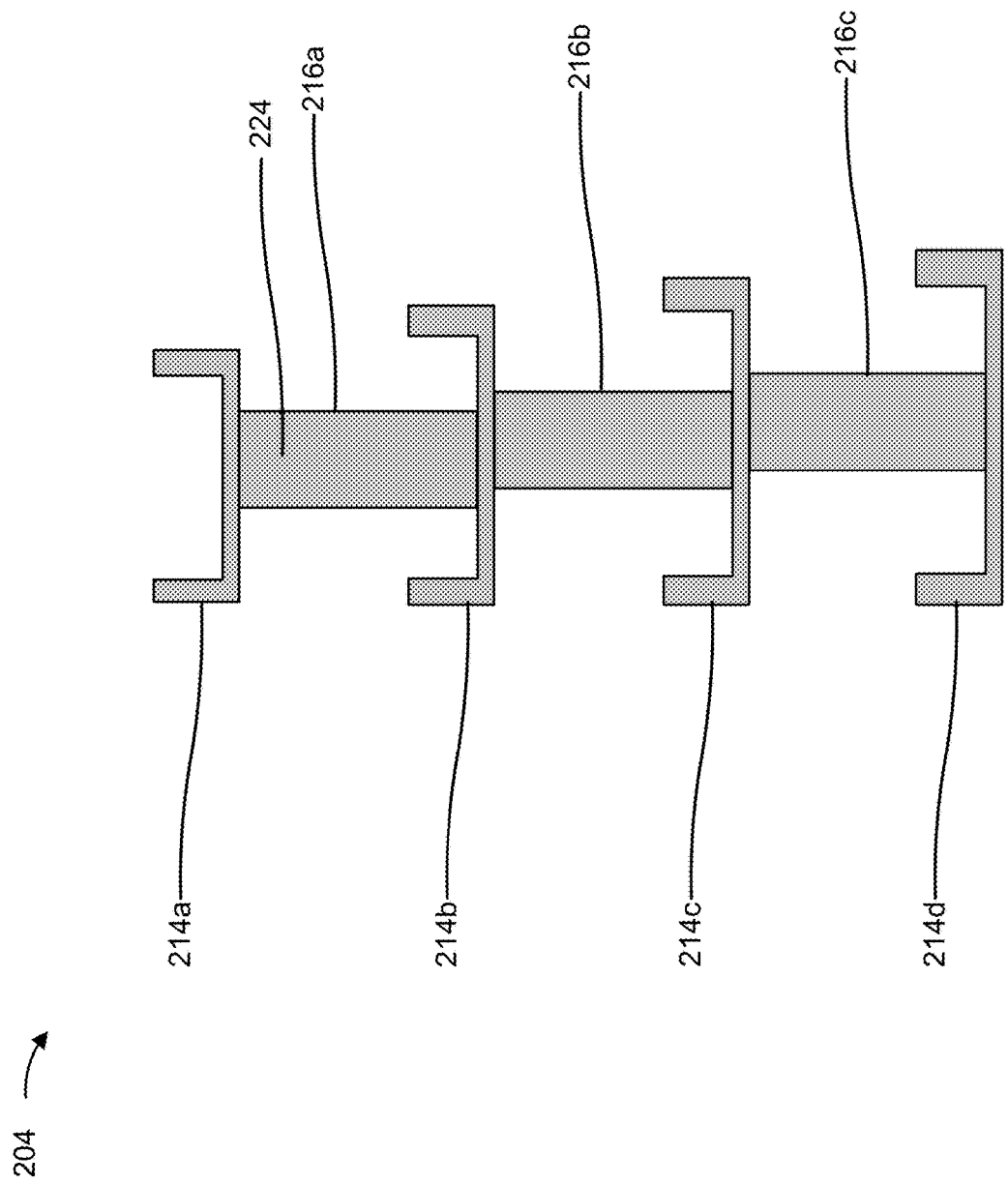

FIGS. 2A-2C are diagrams of an example radiation source 102 described herein for use in the lithography system 100 of FIG. 1. The radiation source 102 may include an EUV source (e.g., a radiation source that is configured to generate EUV radiation) or another type of radiation source. As shown in FIG. 2A, the radiation source 102 includes various components and/or subsystems, such as an IF cap 202, a scrubber system 204, a vane system 206, a collector flow ring (CFR) 208, a target material catcher 210, a drainage system 212, the droplet generator 122, and the collector 114, among other examples.

The IF cap 202 includes a portion of the vessel 112 that is configured to be orientated toward the intermediate focus 116 of the radiation source 102. The IF cap 202 includes ports, gas sources, and/or other components that are configured to reduce, minimize, and/or otherwise prevent target material debris from transferring from the radiation source 102 to the exposure tool 104 (which might otherwise cause contamination of one or more components in the exposure tool 104).

The scrubber system 204 includes a plurality of gutters 214 and a plurality of rows of fins 216 that extend between the gutters 214. The scrubber system 204 collects target material debris and provides the target material debris through a drain hole 212a to a drain line 212b of the drainage system 212 that connects to the target material catcher 210.

The vane system 206 includes a plurality of vanes 218 that extend in a direction between the collector flow ring 208 and the scrubber system 204. The vane system 206 is configured to collect target material debris and drain the target material debris to the collector flow ring 208 (and further to the target material catcher 210).

The collector flow ring 208 is included between the collector 114 and the vane system 206, and includes a droplet generator port 220 and a target material catcher port 222 on opposing sides of the collector flow ring 208. The droplets 118 are provided through the droplet generator port 220 and into the vessel 112. The droplets 118 traverse across an area in front of the collector 114 such that the laser beam 120 may excite the droplets 118 and generate the radiation 106 for collection by the collector 114. The location at which the laser beam 120 excites the droplets 118 in front of the collector 114 may be referred to as a primary focus. Non-radiated droplets 118 are collected by the target material catcher 210 through the target material catcher port 222 to reduce and/or minimize the generation of target material debris in the vessel 112.

As further shown in FIG. 2A, a coating 224 is included on one or more surfaces of one or more components of the radiation source 102. For example, the coating 224 is included on one or more surfaces of the IF cap 202, on one or more surfaces of the scrubber system 204, on one or more surfaces of the vane system 206 (including one or more surfaces of the vanes 218), on one or more surfaces of the collector flow ring 208 (e.g., one or more surfaces of the droplet generator port 220, one or more surfaces of the target material catcher port 222), one or more surfaces of the drainage system 212 (e.g., one or more surfaces of the drain hole 212a, one or more surfaces of the drain line 212b), one or more surfaces of the interior walls of the vessel 112, and/or one or more other surfaces in the radiation source 102. The one or more surfaces may include bare metal surfaces (e.g., surfaces without another type of coating or finishing included thereon) such as bare stainless steel surfaces, bare copper surfaces, and/or other types of bare metal surfaces.

The coating 224 includes a protective coating that is configured to protect the one or more surfaces (e.g., the one or more bare metal surfaces) of the radiation source 102 from target material contamination and buildup. The coating 224 fills in imperfections (e.g., scratches, low spots, and/or other types of imperfections) in the one or more surfaces (e.g., the one or more bare metal surfaces) to decrease and/or reduce the surface roughness of the one or more surfaces, which increases the flatness and the smoothness of the one or more surfaces. Accordingly, the coating 224 is configured to reduce adhesion of target material particles (e.g., tin (Sn) particles and/or another type of target material particles) to the one or more surfaces (e.g., the one or more bare metal surfaces) of the radiation source 102 (e.g., during an exposure operation of the lithography system 100). Moreover, the coating 224 is configured to repel target material particles from the one or more surfaces (e.g., the one or more bare metal surfaces) of the radiation source 102. Additionally, the coating 224 is configured to resist buildup of target material particles on the one or more surfaces (e.g., the one or more bare metal surfaces) of the radiation source 102 (e.g., during an exposure operation of the lithography system 100). Further, the coating 224 is configured to promote and/or facilitate drainage of target material through the drain hole 212a and through the drain line 212b to the target material catcher 210, which reduces target material clogging in the drain hole 212a and in the drain line 212b.

The reduced surface roughness also enables less abrasive cleaning techniques to be used to clean the one or more surfaces of the radiation source 102, which increases the life of the coating 224, increases the time duration between reapplications of the coating 224, and decreases the time duration for cleaning the radiation source 102. Moreover, the coating 224 may include a thermally insulating material and/or a material having a relatively high melting point (e.g., a melting point that greater than the temperatures in the lithography system 100 during the exposure operation, a melting point on the order of thousands of degrees Celsius (e.g., 1000 degrees Celsius, 2000 degrees Celsius) or greater) that resists thermal damage to the one or more surfaces of the radiation source 102 (e.g., by reducing and/or resisting the transfer of heat to the one or more surfaces of the radiation source 102). This enables the lithography system 100 to operate at greater operating temperatures.

Additionally, the coating 224 provides resistance against oxidation of the one or more surfaces of the radiation source 102. In particular, the coating 224 reduces and/or prevents atmospheric oxygen from reaching and interacting with the one or more bare metal surfaces of the radiation source 102. This reduces the likelihood of the atmospheric oxygen resulting in corrosion of the one or more bare metal surfaces of the radiation source 102. Moreover, the coating 224 may be water repellent, may resist smudging of the surface 1002, and/or may repel dirt and/or oil from the surface 1002, among other examples.

The coating 224 may include a nano coating or nanoscale coating, a micro coating or microscale coating, and/or another type of coating. A nanoscale coating includes nanoscale particles (e.g., particles having a size that is on the order of nanometers, ranging from greater than 0 nanometers to less than 1 micrometer). A microscale coating includes microscale particles (e.g., particles having a size that is on the order of micrometers, ranging from greater than 0 micrometers to less than one millimeter). The particles may include single-element particles (e.g., particles that include one type of elemental material) and/or molecule particles (e.g., particles that include two or more types of elemental materials).

Examples of the coating 224 for reducing adhesion of target material to the one or more bare metal surfaces of the radiation source 102 include a nanoscale oxide coating (e.g., tantalum oxide ($Ta_xO_y$ such as $Ta_2O_5$), titanium oxide ($TiO_x$ such as $TiO_2$), silicon oxide ($SiO_x$ such as $SiO_2$ (quartz or silica)), aluminum oxide ($Al_xO_y$ such as $Al_2O_3$), hafnium oxide ($HfO_x$ such as $HfO_2$), zirconium oxide ($ZrO_x$ such as $ZrO_2$), and/or another type of nanoscale oxide coating), a nanoscale nitride coating (e.g., silicon nitride ($Si_xN_y$ such as $Si_3N_4$) or another type of nanoscale nitride coating), a nanoscale titanate coating (e.g., barium-strontium-titanate (BST) particles, lead-zirconium-titanate (PZT) particles, and/or another type of nanoscale titanate coating), nanoscale glass coating, a nanoscale ceramic coating, a nanoscale hydrophobic polymer coating (e.g., polytetrafluoroethylene (PTFE) and/or another nanoscale hydrophobic coating), a nanoscale acrylic coating, a nanoscale amide coating, a nanoscale imide coating, a nanoscale dienes coating, a nanoscale carbonate coating, a nanoscale ester coating, a nanoscale ether coating, a nanoscale epichlorohydrin coating, a nanoscale fluorocarbon coating, a nanoscale silicate coating (e.g., a silicate $[SiO_{4-x}^{(4-2x)-}]n$ where $0 \leq x < 2$, an orthosilicate $[SiO_4{}^{4-}]$, a metasilicate $[SiO_3{}^{2-}]$, a pyrosilicate $[Si_2O_7{}^{6-}]n$, a sodium metasilicate, a polymetric molecular silicate, a hexafluorosilicate, an inorganic silicate, and/or another type of nanoscale silicate coating), a nanoscale fluorosilicate coating (e.g., a coating that includes a combination of an organic fluorocarbon and an inorganic silicate), a nanoscale cement coating, a nanoscale waterglass coating (e.g., a coating including sodium oxide ($Na_xO$) and silicon dioxide ($SiO_2$)), a nanoscale silicon carbon coating, a thin film coating, a dielectric coating, a dielectric thin film coating, another type of nanoscale coating, and/or a combination thereof.

As shown in FIG. 2B, the coating 224 may be included on one or more surfaces of the IF cap 202. The one or more surfaces may include one or more interior surfaces, one or more bare metal surfaces, and/or one or more surfaces that are likely to be exposed to target material in operation of the lithography system 100, among other examples.

As shown in FIG. 2C, the scrubber system 204 includes a plurality of gutters 214a-214d (which may include a quantity of gutters that is greater or less than what is illustrated in FIG. 2C) and a plurality of rows of fins 216a-216c (which may include a quantity of rows of fins that is greater or less than what is illustrated in FIG. 2C) that extend between pairs of the gutters 214a-214d. The gutters 214a-214d include ring-shaped structures that are configured to catch and collect target material debris in the vessel 112. Each of the gutters 214a-214d includes an approximately flat cross-section and raised edges on each side of the approximately flat cross-section. The height of the edges is greater than the height of the approximately flat cross-section to contain the target material debris collected in the gutters 214a-214d.

The rows of fins 216a-216c each include a plurality of fins that are configured to collect target material debris in the vessel 112 and to drain the target material debris between pairs of the gutters 214a-214d. For example, the row of fins 216a is configured to collect and drain target material debris to the gutter 214b, the row of fins 216b is configured to collect and drain target material debris to the gutter 214c, and the row of fins 216c is configured to collect and drain target material debris to the gutter 214d. In some implementations, a drain line is provided from the top gutter (e.g., the gutter 214a) to the bottom gutter (e.g., the gutter 214d) to enable the target material debris to drain downward in the scrubber system 204. The target material debris collected in the lowest gutter (e.g., the gutter 214d) in the vessel 112 may drain through the drain hole 212a and into the drain line 212b of the drainage system 212 to the target material catcher 210.

As further shown in FIG. 2C, the coating 224 may be included on one or more surfaces (e.g., one or more interior surfaces, one or more bare metal surfaces, one or more surfaces that are likely to be exposed to target material in operation of the lithography system 100) of one or more components of the scrubber system 204. For example, the coating 224 may be included on one or more surfaces of the gutters 214a-214c. Additionally, or alternatively, the coating 224 may be included on one or more surfaces of the rows of fins 216a-216c.

As indicated above, FIGS. 2A-2C are provided as examples. Other examples may differ from what is described with regard to FIGS. 2A-2C.

Figure 3B:
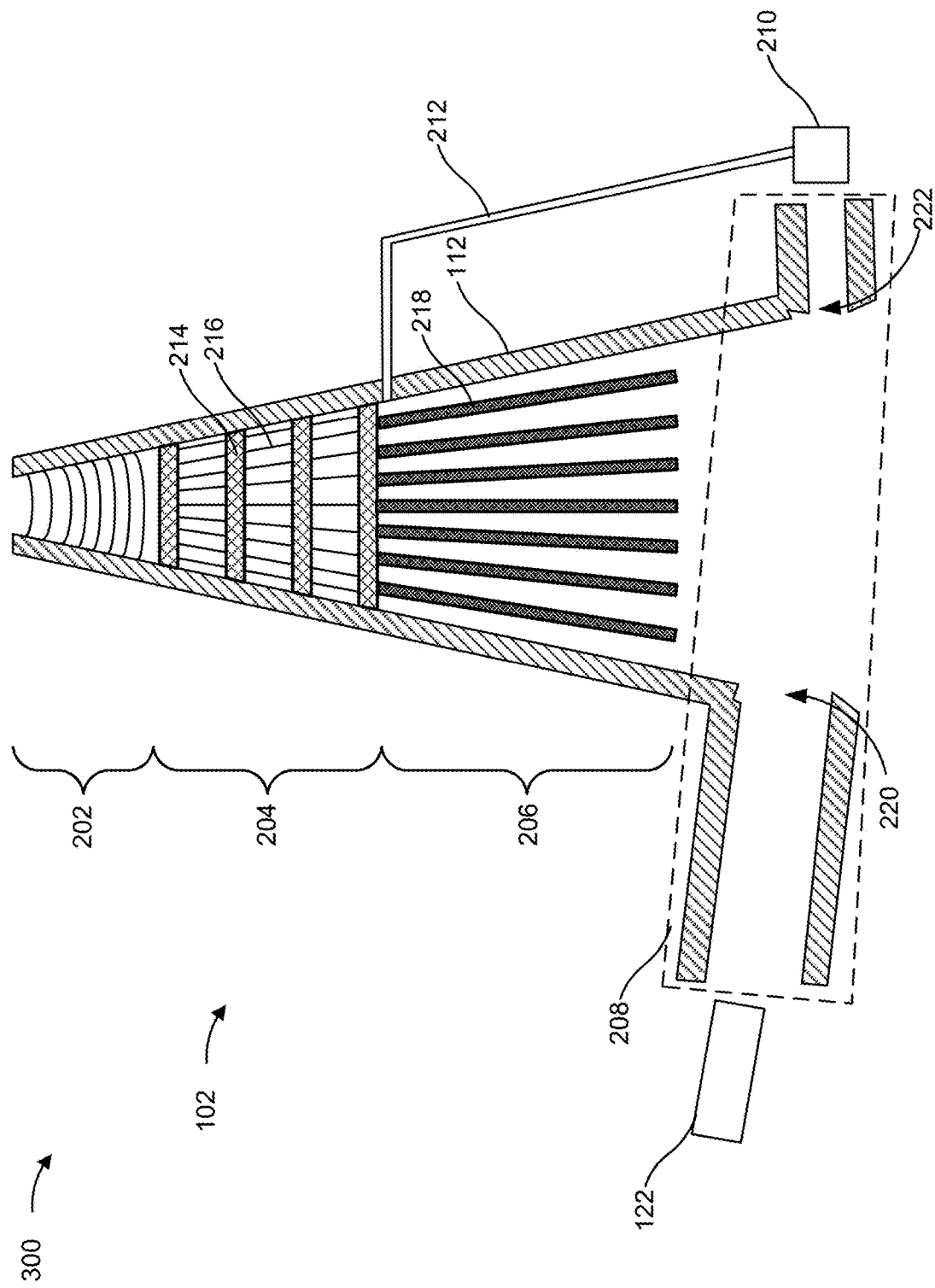

FIGS. 3A-3E are diagrams of an example implementation 300 described herein. The example implementation 300 includes an example of forming the coating 224 on the one or more surfaces (e.g., the one or more bare metal surfaces) of the radiation source 102 and/or one or more components included in the radiation source 102. FIG. 3A illustrates the radiation source 102 prior to formation of the coating 224. In the example in FIG. 3A, the one or more bare metal surfaces of the radiation source 102 are exposed to atmospheric and/or environmental conditions in the radiation source 102.

Turning to FIG. 3B, the radiation source 102 may be deactivated, and the collector 114 may be removed (e.g., manually or automatically by a robot for example) from the radiation source 102 to provide access into the vessel 112 for cleaning and formation of the coating 224. In some implementations, one or more surfaces of the radiation source 102 are cleaned at particular time intervals and/or based on a maintenance schedule. For example, the one or more surfaces may be cleaned at approximately 6 week intervals to approximately 8 week intervals to maintain sufficient performance and efficiency for the radiation source 102. However, other service schedules or maintenance schedules are within the scope of the present disclosure.

Figure 3C:
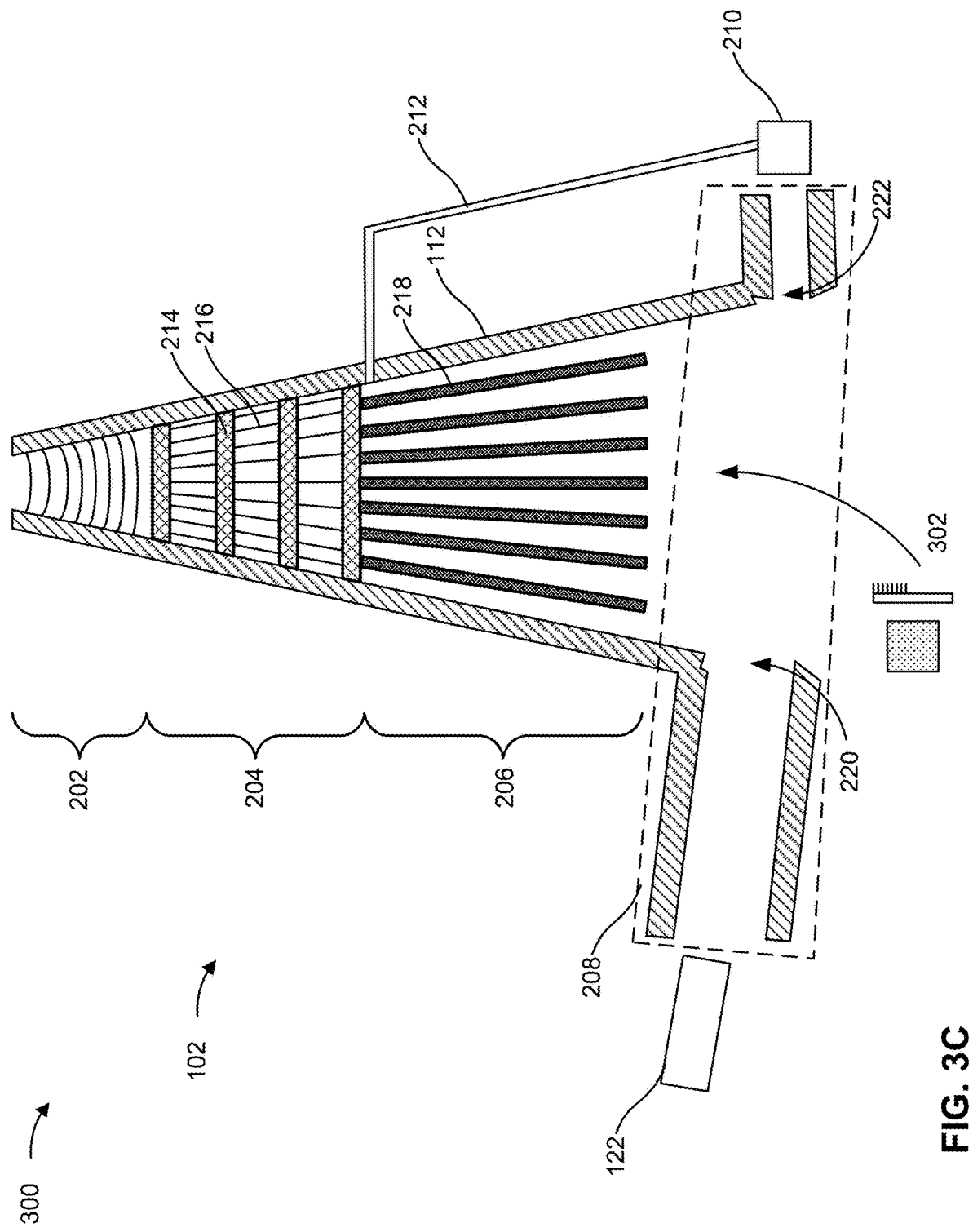

As shown in FIG. 3C, a physical cleaning operation 302 is performed to remove target material buildup from the one or more surfaces (e.g., from the one or more bare metal surfaces) in the radiation source 102. For example the physical cleaning operation 302 may be performed to remove target material buildup from one or more bare metal surfaces of the IF cap 202, from one or more bare metal surfaces of the scrubber system 204, from one or more bare metal surfaces of the vane system 206, from one or more bare metal surfaces of the collector flow ring 208, from one or more bare metal surfaces of the drainage system 212, from one or more bare metal surfaces of the interior walls of the vessel 112, and/or from other bare metal surfaces in the vessel 112.

In some implementations, the physical cleaning operation 302 includes manual cleaning of the one or more components by maintenance personnel. In some implementations, the physical cleaning operation 302 includes an automated cleaning operation in which an automated cleaning tool is positioned to automatically clean the one or more surfaces of the radiation source 102. The physical cleaning operation 302 may include cleaning with a brush, with a cleaning towel, with a polishing tool, with a grinding tool (e.g., a grinding wheel, sandpaper) to physically remove the target material from the one or more surfaces of the radiation source 102.

Figure 3D:
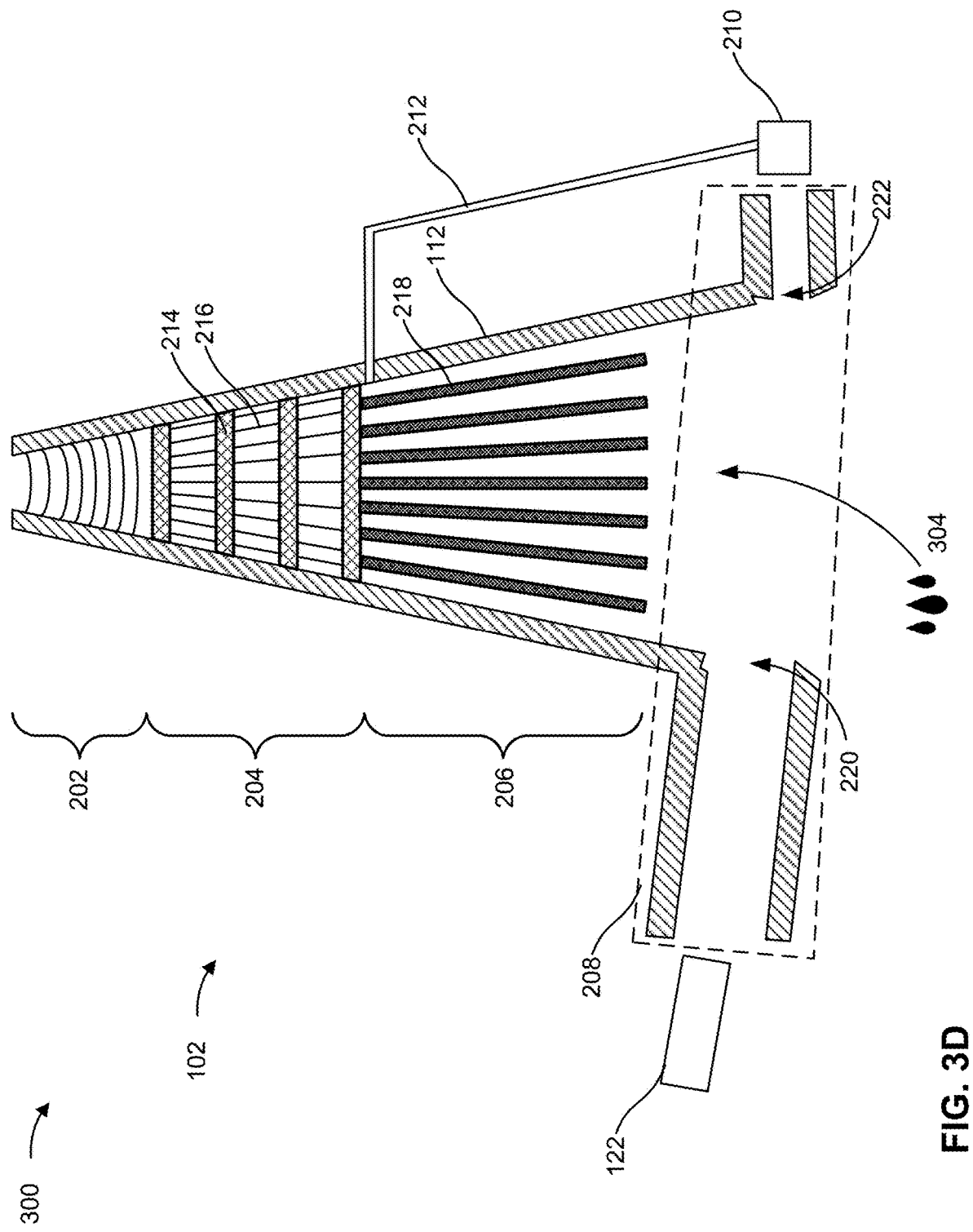

As shown in FIG. 3D, a chemical cleaning operation 304 is performed to remove loose target material debris from the one or more surfaces (e.g., the one or more bare metal surfaces) of the radiation source 102. The target material debris may be generated and/or may result from the physical cleaning operation 302. In particular, the physical cleaning techniques performed in the physical cleaning operation 302 removes the target material buildup from the one or more surfaces, and causes a portion of the removed target material to become airborne and to land back onto the one or more surfaces as loose target material debris (e.g., target material debris that is located on but not bonded to the one or more bare metal surfaces).

Accordingly, the chemical cleaning operation 304 is performed to remove the loose target material from the one or more surfaces using wet chemicals to minimize the likelihood of the loose target material becoming airborne again (which may reduce the effectiveness of the chemical cleaning operation 304 and may result in additional cleaning operations to sufficiently clean the one or more bare metal surfaces in preparation for applying the coating 224). The wet chemicals may include one or more types of cleaning chemicals, such as isopropyl alcohol (IPA), deionized water, and/or another type of wet chemical. The chemical cleaning operation 304 may include a manual procedure in which the wet chemical(s) are applied to a cleaning cloth (which is rubbed against the one or more surfaces to remove the loose target material), or an automated procedure in which an automated cleaning tool cleans the one or more surfaces with one or more wet chemicals.

Figure 3E:
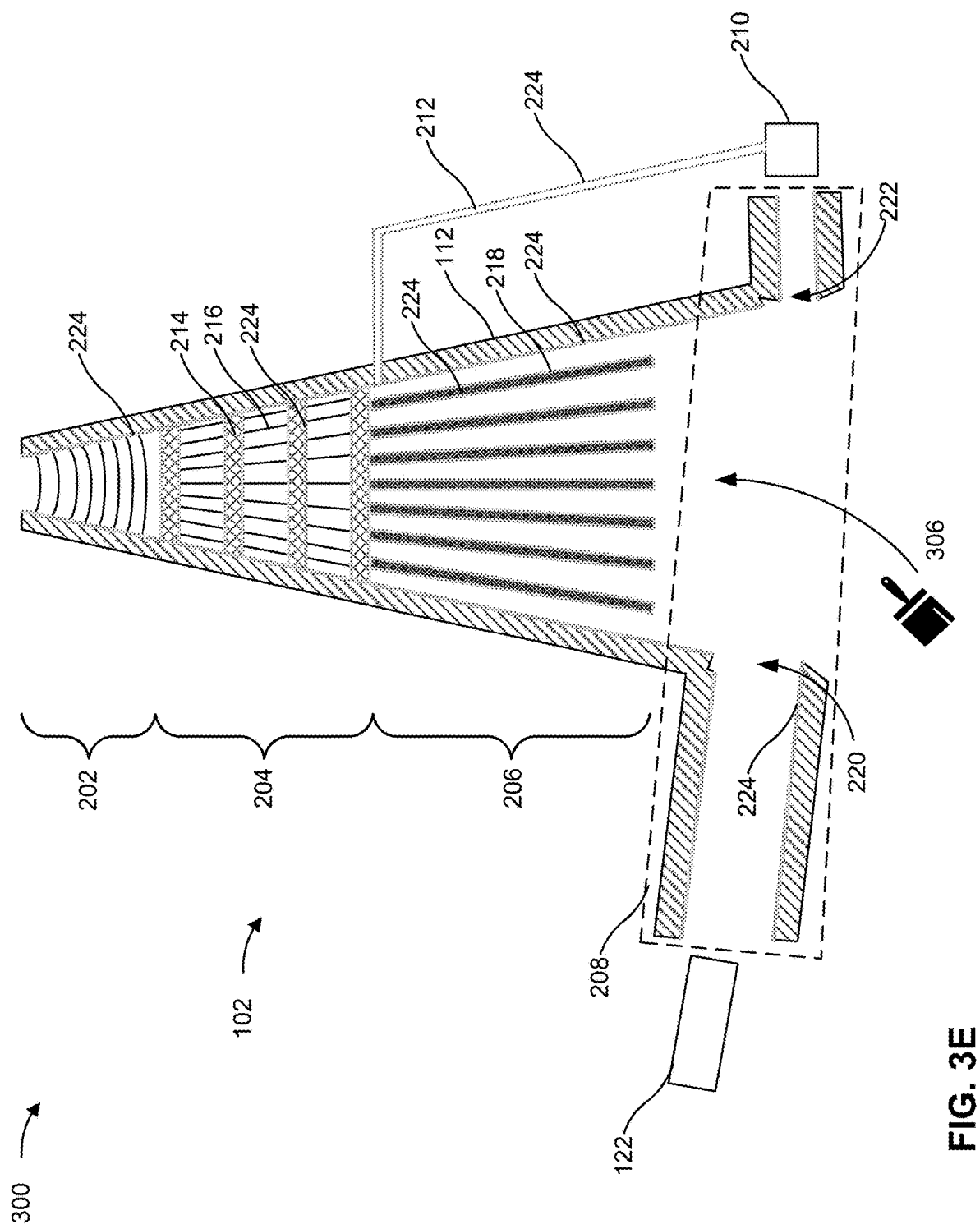

As shown in FIG. 3E, the coating 224 is formed on one or more surfaces (e.g., one or more bare metal surfaces) of the radiation source 102 in a coating operation 306 after the cleaning operations 302 and 304. In some implementations, the coating 224 is formed on the one or more surfaces while one or more components of the radiation source 102 are included in the radiation source 102. In some implementations, the coating 224 is formed on the one or more surfaces while one or more components of the radiation source 102 are removed from the radiation source 102. In some implementations, the coating 224 is applied to the one or more surfaces (e.g., the one or more bare metal surfaces) of the radiation source 102 using an applicator such as a brush, a cloth, a sponge, or another type of applicator. In some implementations, the coating 224 is applied to the one or more surfaces (e.g., the one or more bare metal surfaces) of the one or more components by spraying the coating 224 onto the one or more surfaces.

In some implementations, the coating 224 is formed to a thickness in a range of approximately 1 nanometer to a plurality of micrometers such that the coating 224 provides sufficient resistance to target material adhesion, sufficient resistance to thermal damage, and/or sufficient resistance to oxidation. However, other values for the thickness of the coating 224 are within the scope of the present disclosure. In some implementations, the coating 224 is applied in a single layer to the one or more surfaces of the radiation source 102, and the coating 224 is permitted to dry, solidify, and/or cure before the lithography system 100 is placed back into operation. The coating 224 may include a nanoscale coating (e.g., a coating having a single-layer thickness on the order of nanometers and less than one micrometer), a microscale coating (e.g., a coating having a single-layer thickness on the order of micrometers), or another type of coating. In some implementations, the coating 224 is left on the one or more surfaces for a particular time period (e.g., 1 minute, 3 minutes, or another time duration) before excess material of the coating 224 is removed.

In some implementations, the coating 224 is applied by forming a plurality of layers of the coating 224 on the one or more surfaces (e.g., the one or more bare metal surfaces) of the radiation source 102. In these implementations, the layers of the coating 224 may be permitted to dry or cure before subsequent layers are formed. Moreover, the one or more surfaces may be heated (e.g., using a heating tool, an oven, a thermal chamber, or another device) in between formation of layers of the coating 224 to decrease the drying or curing time and/or to otherwise reduce formation time for the layers. This reduces the time duration for forming the coating 224, which reduces downtime of the lithography system 100. In some implementations, the one or more surfaces are heated to a temperature in a range of approximately 50 degrees Celsius to approximately 200 degrees Celsius to reduce formation times while minimizing damage to the coating 224 and/or to the components of the radiation source 102. However, other values for the temperature are within the scope of the present disclosure.

Alternatively, the coating 224 may be formed on one or more "new" components of the radiation source 102 (e.g., one or more components that have not been used in the lithography system 100 and/or that are installed in the radiation source 102 for the first time). In these implementations, the radiation source 102 is disassembled to install the "new" component(s) in the radiation source 102 as replacement(s). In this way, the coating 224 may be formed on the one or more "new" components prior to a first use of the one or more "new" components in the lithography system 100 (with or without first performing the cleaning operations 302 and 304 on the one or more "new" components).

After the coating operation 306 is completed, the collector 114 may be installed in the radiation source 102, the radiation source 102 may be reassembled and recalibrated, and the lithography system 100 may be placed back into operation with the coating 224 applied on the one or more surfaces of the radiation source 102.

The operations described in connection with FIGS. 3A-3E may be subsequently repeated to reapply the coating 224 to the one or more surfaces of the radiation source 102. In some implementations, the operations described in connection with FIGS. 3A-3E are repeated to reapply the coating 224 based on a maintenance schedule for the radiation source 102. In some implementations, the operations described in connection with FIGS. 3A-3E are repeated to reapply the coating 224 after a particular time duration (e.g., 1 year, 3 years, 10 years, and/or another time duration) from initially forming the coating 224 or from the last application of the coating 224. In some implementations, the operations described in connection with FIGS. 3A-3E are repeated to reapply the coating 224 based on an automated inspection of the coating 224 (e.g., using an image sensor and/or a controller). In these implementations, a device (e.g., the device 1100 of FIG. 11) may determine that the surface roughness of the coating 224 does not satisfy a surface roughness threshold, and may cause the coating 224 to be reapplied based on the determination.

In some implementations, a device (e.g., the device 1100 of FIG. 11) determines a time for reapplying the coating 224 using a machine learning model. In these implementations, the device uses the machine learning model to estimate the time for reapplying the coating 224 by providing various parameters as input to the machine learning model, such as a thickness of the coating 224 that was applied (e.g., prior to reapplication of the coating 224), anticipated exposure types and/or anticipated exposure intensities for exposure operations of the lithography system 100, estimated operating temperatures for the exposure operations, and/or another parameter.

As indicated above, FIGS. 3A-3E are provided as one or more examples. Other examples may differ from what is described with regard to FIGS. 3A-3E.

Figure 4:
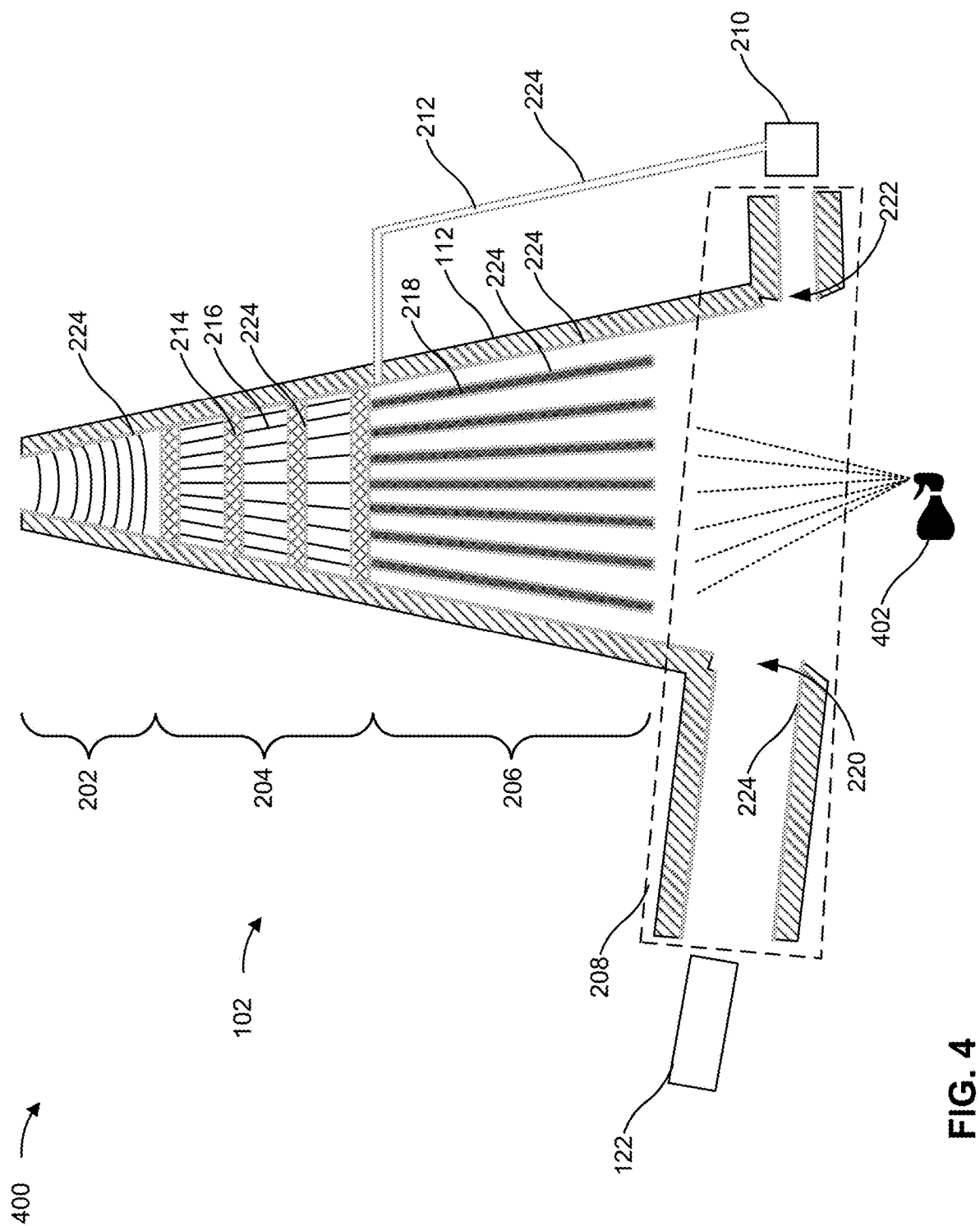

FIG. 4 is a diagram of an example implementation 400 described herein. The example implementation 400 includes an alternative example of forming the coating 224 on the one or more surfaces of the one or more components included in the radiation source 102. In particular, the example implementation 400 includes an example of forming the coating 224 on the one or more surfaces of the one or more components included in the radiation source 102 by a coating operation 402 that includes a spraying operation. The coating operation 402 may be performed after the physical cleaning operation 302 described in connection with FIG. 3C, may be performed after the chemical cleaning operation 304 described in connection with FIG. 3D, or may be performed on one or more "new" components of the radiation source 102 (e.g., without one or more cleaning operations).

As shown in FIG. 4, the coating operation 402 may be performed after removal of the collector 114 from the radiation source 102. The coating 224 may be sprayed onto the one or more surfaces of the one or more components of the radiation source 102 in the coating operation 402 using a spray bottle, a compressed air canister, a compressor and spraying device, or another type of spraying system. After the coating operation 402, the collector 114 may be installed in the radiation source 102. A leak test may be performed to identify leaks in the vessel 112. After the leak test, the vessel 112 may be heated, the radiation source 102 may be calibrated, and the lithography system 100 may be placed into operation.

As indicated above, FIG. 4 is provided as an example. Other examples may differ from what is described with regard to FIG. 4.

Figure 5:
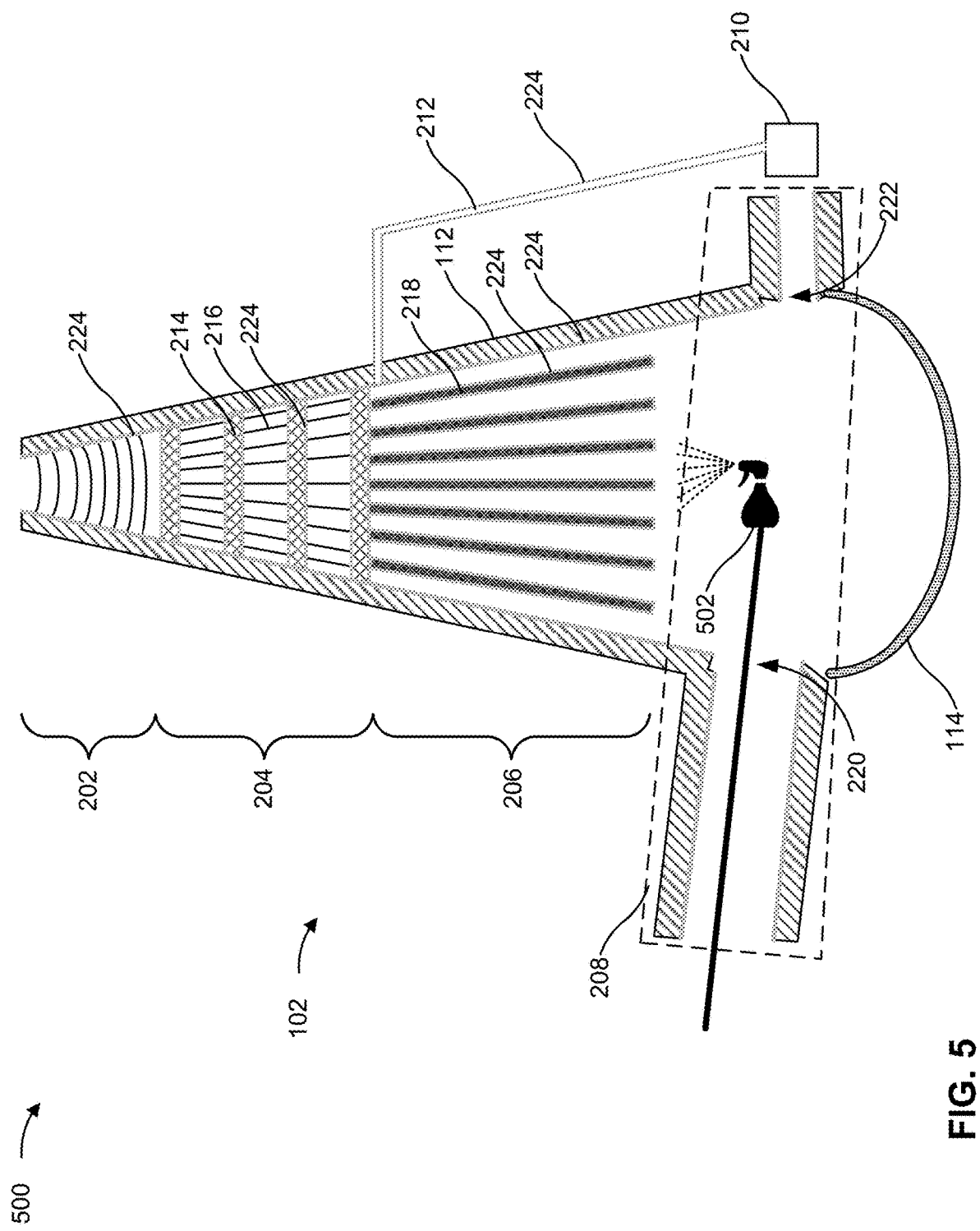

FIG. 5 is a diagram of an example implementation 500 described herein. The example implementation 500 includes an alternative example of forming the coating 224 on the one or more surfaces of the one or more components included in the radiation source 102. In particular, the example implementation 500 includes an example of automatically forming the coating 224 on the one or more surfaces the one or more components included in the radiation source 102 by an automated coating operation 502 that includes a spraying operation. The coating operation 502 may be performed after the physical cleaning operation 302 described in connection with FIG. 3C, may be performed after the chemical cleaning operation 304 described in connection with FIG. 3D, or may be performed on one or more "new" components of the radiation source 102 (e.g., without one or more cleaning operations).

As shown in FIG. 5, the coating operation 502 may be performed without removal of the collector 114 from the radiation source 102. An automated spraying device may be inserted into the vessel 112 through the droplet generator port 226 (e.g., in the collector flow ring). The droplet generator 122 may be removed from the radiation source 102 such that the automated spraying tool may be inserted into the vessel 112 through the droplet generator port 226. The automated spraying tool may be automatically inserted into the vessel 112 by an automated positioning system that includes an elongated support member and a gimble, a servo motor, a linear motor, and/or a stepper motor, among other examples.

The coating 224 may be sprayed onto the one or more surfaces of the one or more components of the radiation source 102 in the coating operation 502 using an automated spraying system. The automated spraying system may include sensors, a controller, and/or other components that are configured to identify the surfaces on which the automated spraying system is to spray the coating 224, to determine whether the automated spraying system has formed the coating 224 to a sufficient thickness (e.g., to a thickness that satisfies a thickness threshold), and/or to perform other actions associated with forming the coating 224. After the coating operation 502, a leak test may be performed to identify leaks in the vessel 112. After the leak test, the vessel 112 may be heated, the radiation source 102 may be calibrated, and the lithography system 100 may be placed into operation.

As indicated above, FIG. 5 is provided as an example. Other examples may differ from what is described with regard to FIG. 5.

Figure 6A:
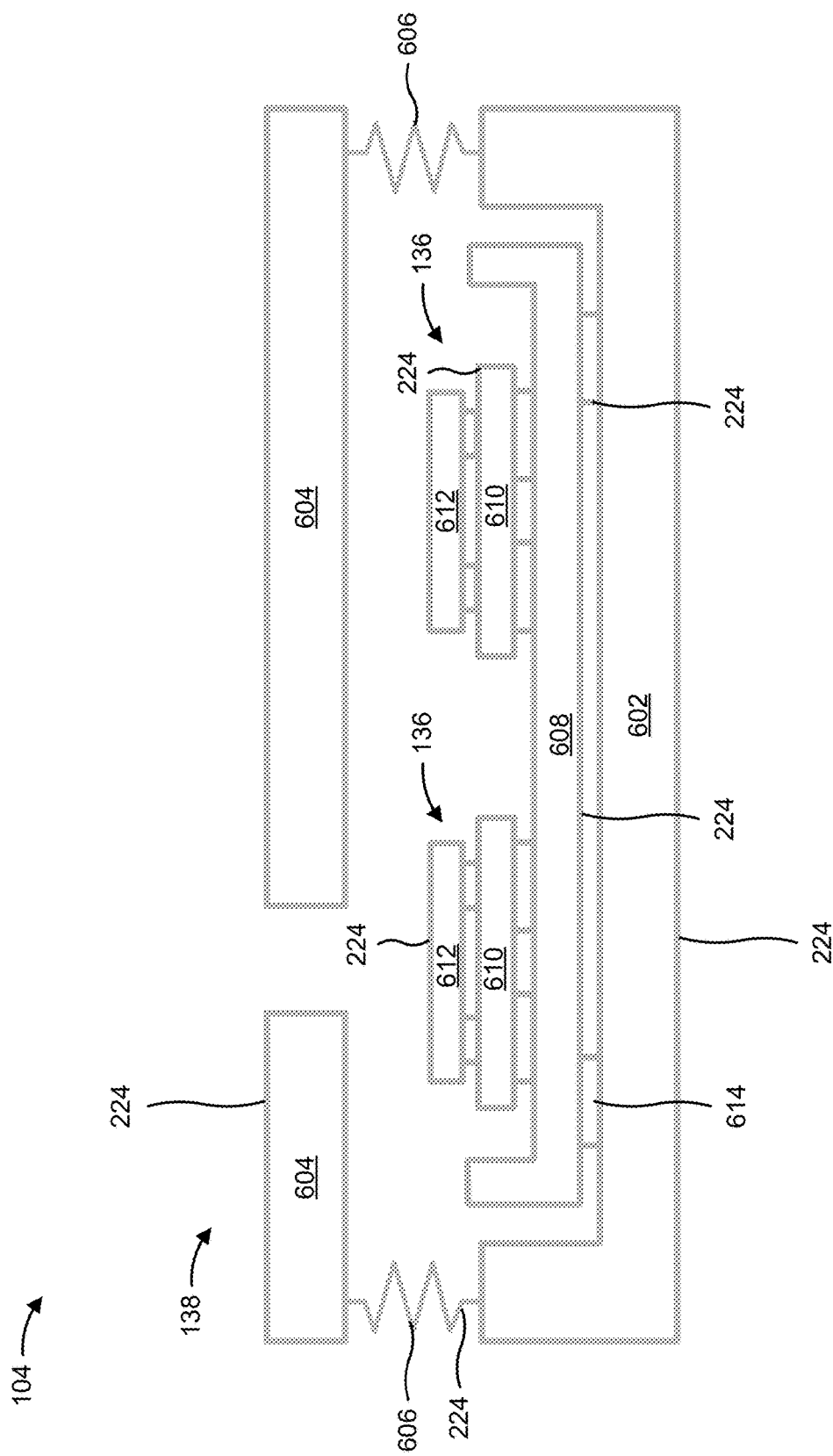
FIGS. 6A and 6B are diagrams of example components of an exposure tool described herein for use in the lithography system of FIG. 1.
Figure 6B:
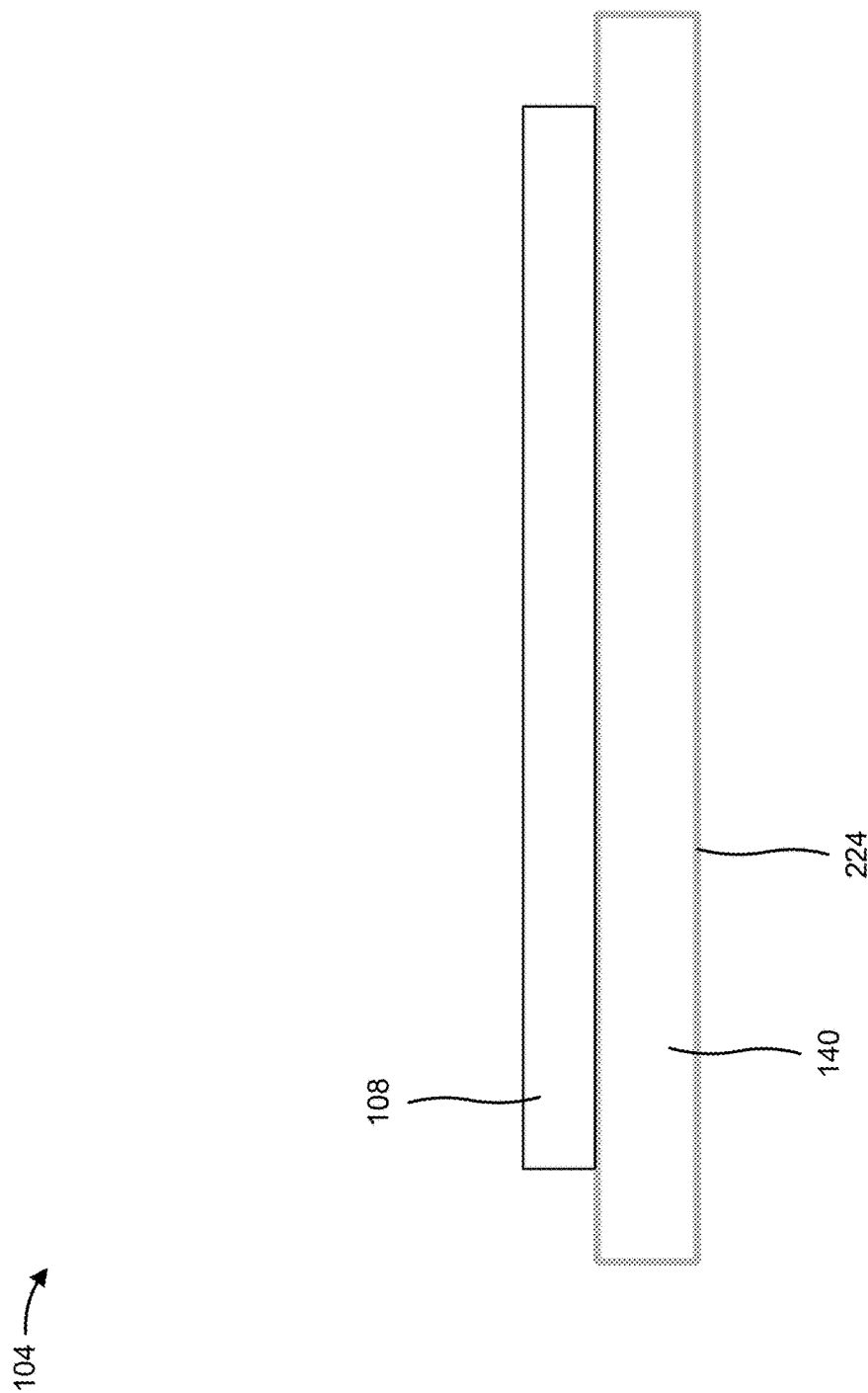

FIGS. 6A and 6B are diagrams of example components of the exposure tool 104 described herein for use in the lithography system 100 of FIG. 1. FIG. 6A illustrates an example bottom module 138 of the exposure tool 104. FIG. 6B illustrates an example reticle stage 140 of the exposure tool 104. FIGS. 6A and 6B illustrate examples of the coating 224 being included on one or more components of the bottom module 138 and on the reticle stage 140.

As shown in FIG. 6A, the bottom module 138 includes a base frame 602 (which may also be referred to as a support frame). The base frame 602 interfaces with the floor of a semiconductor processing environment in which the lithography system 100 is located. The base frame 602 further supports other components included in the bottom module 138. In some implementations, wheels, castors, or other components are included on the bottom of the base frame 602 to permit the base frame 602 to slide or displace relative to the exposure tool 104. This permits the base frame 602 to be removed from the exposure tool 104.

A metrology frame 604 is located above the base frame 602 and separates the bottom module 138 from a vacuum chamber in which the illuminator 126 and the projection optics box 128 are located. An opening is included in the metrology frame 604 to permit the radiation 106 to project into the bottom module 138 and toward a wafer stage 136. The metrology frame 604 and the base frame 602 are coupled in an elastomeric manner by isolation components 606. The isolation components 606 provide vibration isolation between the bottom module 138 and the metrology frame 604 by reducing the transfer of vibrations between the bottom module 138 and the metrology frame 604. The isolation components 606 include springs, an active vibration isolation system, a suspension system, and/or an air mount system, among other examples.

A balance mass 608 is included and/or positioned over the base frame 602. One or more wafer stages 136 are included and/or positioned over the balance mass 608. In some implementations, the bottom module 138 includes a plurality of wafer stages 136. A first wafer stage 136 may be utilized for exposing a first semiconductor substrate 110 to the radiation 106 while a second wafer stage 136 is utilized for measurement and alignment purposes of a second semiconductor substrate 110 in preparation for exposure. In this way, the plurality of wafer stages 136 may enable increased throughput of the lithography system by performing simultaneous actions on a plurality of semiconductor substrates 110 to reduce queue times.

The balance mass 608 is configured to absorb and/or counteract movement and/or vibration of the wafer stage(s) 136. This may enable the wafer stage(s) 136 to move more smoothly and with less perturbation to the semiconductor substrate(s) 110 included thereon, which decreases the likelihood of misalignment and yield loss.

A wafer stage 136 includes a chuck 610 and a wafer table 612. The chuck 610 is included over the balance mass 608. The wafer table 612 (or wafer clamp) is included over the chuck 610. The chuck 610 is configured to secure a semiconductor substrate 110 to the wafer table 612 by electrostatic force (e.g., an electrostatic chuck, e-chuck, or ESC), a vacuum force (e.g., a vacuum chuck), or another type of force. The wafer table 612 is configured to support a semiconductor substrate 110 on the wafer table 612. The wafer table 612 includes a substantially round structure that is sized to accommodate one or more sizes of semiconductor substrates 110, such as 200 millimeter semiconductor substrates 110, 300 millimeter semiconductor substrates 110, and/or another size of semiconductor substrates 110. In some implementations, the wafer table 612 includes another shape, such as a substantially square shape or a substantially rectangular shape, among other examples.

The balance mass 608 is supported on isolation structures 614 between the balance mass 608 and the base frame 602. The isolation structures 614 include air feet, springs, and/or another type of isolation structures. Isolation structures 614 are included between the chuck 610 and the balance mass 608, and between the wafer table 612 and the chuck 610.

As further shown in FIG. 6A, the coating 224 (e.g., a protective coating, a nano coating) may be included on one or more surfaces of one or more components of the bottom module 138. In particular, the coating 224 may be included on one or more bare metal surfaces of the one or more components of the bottom module 138 (e.g., one or more surfaces of one or more metallic components that do not include or have another type of coating included thereon). The one or more bare metal surfaces may include stainless steel, copper, titanium, and/or another type of metal. The one or more components of the bottom module 138 may include one or more components that are exposed to (or are likely to be exposed to) target material during an exposure operation of the lithography system 100. For example, the coating 224 may be included on one or more surfaces of the base frame 602, one or more surfaces of the metrology frame 604, one or more surfaces of the isolation components 606, one or more surfaces of the balance mass 608, one or more surfaces of the wafer stages 136 (including the chucks 610 and/or the wafer tables 612), and/or one or more surfaces of the isolation structures 614.

As shown in FIG. 6B, the coating 224 may be included on one or more surfaces of the reticle stage 140 (e.g., the reticle stage 140 that is configured to support and/or secure the reticle 108). The coating 224 may be included to protect against buildup and/or accumulation of the target material without reducing the effectiveness of the reticle stage 140 to support and/or secure the reticle 108. The coating 224 may include one or more of the coating materials described above in connection with FIGS. 2A-2C.

The coating 224 on the one or more surfaces of the one or more components of the bottom module 138, and the coating 224 on the one or more surfaces of the reticle stage 140, are configured to repel the target material and resist buildup of the target material on the one or more surfaces during an exposure operation of the lithography system 100. In particular, the coating 224 fills in low spots, scratches, and other types of imperfections in the one or more surfaces of the one or more components of the bottom module 138 and in the one or more surfaces of the reticle stage 140. This reduces or decreases the surface roughness of the one or more surfaces of the one or more components of the bottom module 138 and the one or more surfaces of the reticle stage 140. The reduced surface roughness reduces the surface area on which the target material can build up and/or accumulate, which results in the resistance to the buildup and/or accumulation of the target material. The reduced surface roughness also provides reduced adhesion of the target material to the one or more surfaces of the one or more components of the bottom module 138 and to the one or more surfaces of the reticle stage 140, which enables less abrasive cleaning techniques to be used to clean the one or more surfaces of the one or more components of the bottom module 138 and the one or more surfaces of the reticle stage 140, which increases the life of the coating 224 and increases the time duration between reapplications of the coating 224.

Moreover, the coating 224 may include a thermally insulating material and/or a material having a relatively high melting point (e.g., a melting point that greater than the temperatures in the lithography system 100 during the exposure operation, a melting point on the order of thousands of degrees Celsius (e.g., 1000 degrees Celsius, 2000 degrees Celsius) or greater) that resists thermal damage to the one or more surfaces of the one or more components of the bottom module 138 and/or to the one or more surfaces of the reticle stage 140 (e.g., by reducing and/or resisting the transfer of heat to the one or more surfaces of the one or more components of the bottom module 138 and/or to the one or more surfaces of the reticle stage 140).

Additionally, the coating 224 provides resistance against oxidation of the one or more surfaces of the one or more components of the bottom module 138 and of the one or more surfaces of the reticle stage 140. In particular, the coating 224 reduces and/or prevents atmospheric oxygen from reaching and interacting with the one or more surfaces of the one or more components of the bottom module 138 and the one or more surfaces of the reticle stage 140. This reduces the likelihood of the atmospheric oxygen resulting in corrosion of the one or more surfaces of the one or more components of the bottom module 138 and of the one or more surfaces of the reticle stage 140.

As indicated above, FIGS. 6A and 6B are provided as examples. Other examples may differ from what is described with regard to FIGS. 6A and 6B.

Figure 7A:
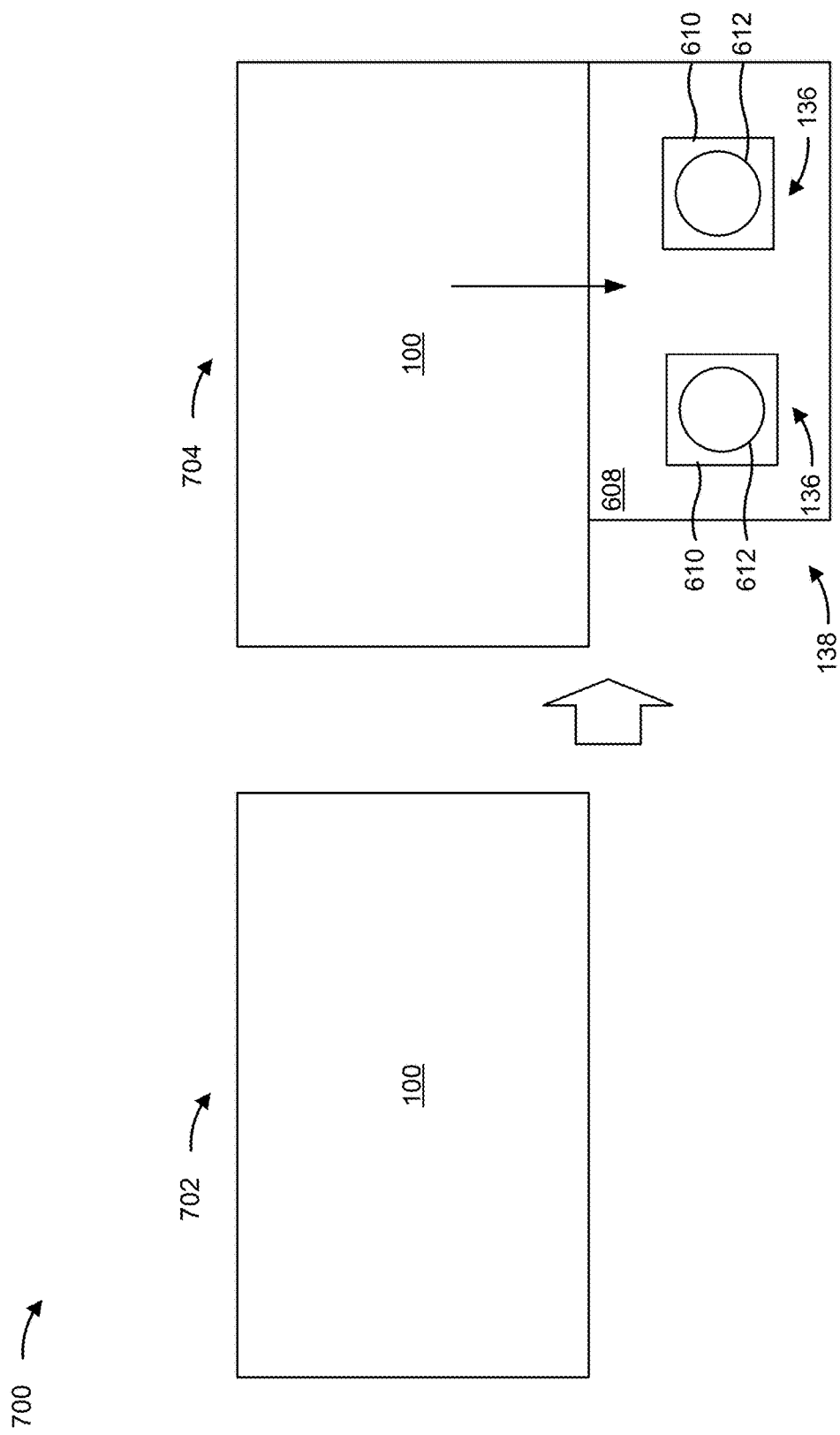
FIGS. 7A-7C are diagrams of an example implementation described herein.
Figure 7B:
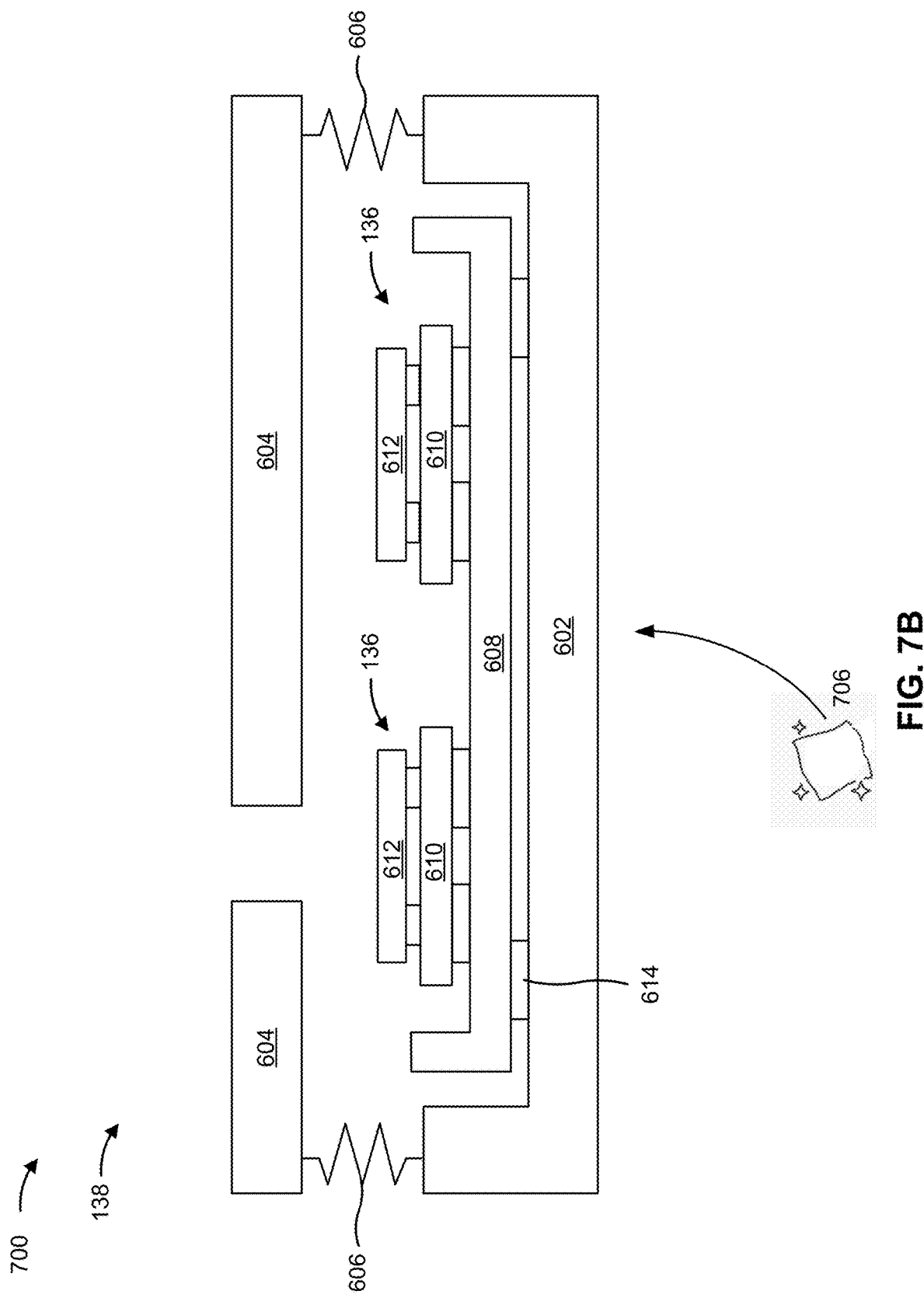
Figure 7C:
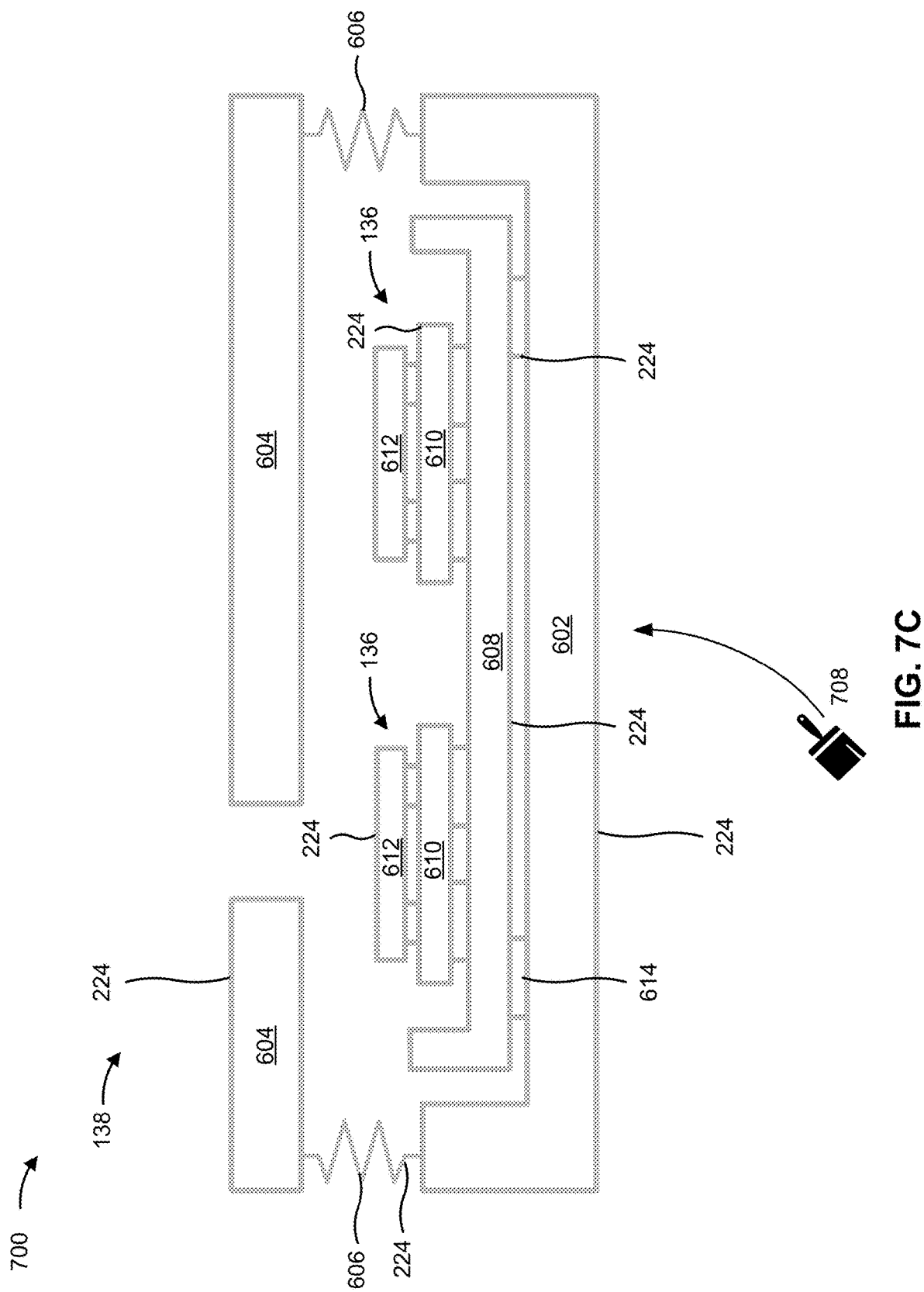

FIGS. 7A-7C are diagrams of an example implementation 700 described herein. The example implementation 700 includes an example of forming the coating 224 on the one or more surfaces of the one or more components of the bottom module 138.

As shown in FIG. 7A, the lithography system 100 is transitioned from an assembled configuration 702 to a disassembled configuration 704 in which the bottom module 138 is at least partially removed from the lithography system 100 (e.g., from the exposure tool 104 of the lithography system 100). Transitioning the lithography system 100 from the assembled configuration 702 to the disassembled configuration 704 provides access to the wafer stage(s) 136 and/or other components of the bottom module 138.

To transition the lithography system 100 from the assembled configuration 702 to the disassembled configuration 704, the bottom module 138 may slide out from the exposure tool 104, may roll out of the exposure tool 104, and/or may otherwise be removed from the exposure tool 104. The bottom module 138 may slide or roll on wheels, castors, rollers, or other components. If the lithography system 100 is pressurized to a vacuum (or a partial vacuum), the lithography system 100 may be vented such that the vacuum is removed prior to removing the bottom module 138 from the lithography system 100.

The lithography system 100 may be transitioned from the assembled configuration 702 to the disassembled configuration 704 to enable cleaning of one or more components of the bottom module 138. For example, one or more surfaces of the wafer stages 136, one or more surfaces of the base frame 602, one or more surfaces of the metrology frame 604, one or more surfaces of the isolation components 606, one or more surfaces of the balance mass 608, one or more surfaces of the wafer tables 612, one or more surfaces of the chucks 610, and/or one or more surfaces of the isolation structures 614 may be cleaned when the lithography system 100 is in the disassembled configuration 704. In some implementations, one or more components of the bottom module 138 are cleaned at particular time intervals and/or based on a maintenance schedule. For example, the wafer tables 612 may be cleaned and/or inspected at approximately 4 week intervals to approximately 6 week intervals to maintain sufficient performance for the wafer table 612. However, other service schedules or maintenance schedules are within the scope of the present disclosure. In some implementations, one or more components of the bottom module 138 are cleaned in preparation for forming the coating 224 on the one or more components.

As shown in FIG. 7B, a cleaning operation 706 is performed for one or more components of the bottom module 138. In some implementations, the cleaning operation 706 includes manual cleaning of the one or more components by maintenance personnel. In some implementations, the cleaning operation 706 includes an automated cleaning operation in which an automated cleaning tool is positioned to automatically clean the one or more components of the bottom module 138. The cleaning operation 706 may include cleaning with a brush, with a cleaning towel, with a polishing tool, with a grinding tool (e.g., a grinding wheel, sandpaper) with one or more types of cleaning chemicals, and/or with one or more other types of cleaning tools.

As shown in FIG. 7C, the coating 224 is formed on one or more surfaces (e.g., one or more bare metal surfaces) of the one or more components of the bottom module 138 in a coating operation 708 after the cleaning operation 706. In some implementations, the coating 224 is formed on the one or more surfaces while the one or more components are included in the bottom module 138. In some implementations, the coating 224 is formed on the one or more surfaces while the one or more components are removed from the bottom module 138. In some implementations, the coating 224 is formed on the one or more surfaces while the lithography system 100 is in the disassembled configuration 704. In some implementations, the coating 224 is formed on the one or more surfaces while the lithography system 100 is in the assembled configuration 702.

In some implementations, the coating 224 is applied to the one or more surfaces of the one or more components using an applicator such as a brush, a cloth, a sponge, or another type of applicator. In some implementations, the coating 224 is applied to the one or more surfaces of the one or more components by spraying the coating 224 onto the one or more surfaces. In these implementations, the coating 224 may be sprayed onto the one or more surfaces using a spray bottle, a compressed air canister, a compressor and spraying device, or another type of spraying system. In some implementations, an automated sprayer system automatically sprays the coating 224 onto the one or more surfaces of the one or more components.

In some implementations, the coating 224 is formed to a thickness in a range of approximately 1 nanometer to a plurality of micrometers such that the coating 224 provides sufficient resistance to target material adhesion, sufficient resistance to thermal damage, and/or sufficient resistance to oxidation. However, other values for the thickness of the coating 224 are within the scope of the present disclosure.

In some implementations, the coating 224 is applied in a single layer to the one or more surfaces of the one or more components of the bottom module 138, and the coating 224 is permitted to dry, solidify, and/or cure before the lithography system 100 is placed back into operation. The coating 224 may include a nanoscale coating (e.g., a coating having a single-layer thickness on the order of nanometers and less than one micrometer), a microscale coating (e.g., a coating having a single-layer thickness on the order of micrometers), or another type of coating. In some implementations, the coating 224 is left on the one or more surfaces for a particular time period (e.g., 1 minute, 3 minutes, or another time duration) before excess material of the coating 224 is removed.

In some implementations, the coating 224 is applied by forming a plurality of layers of the coating 224 on the one or more surfaces of the one or more components of the bottom module 138. In these implementations, the layers of the coating 224 may be permitted to dry or cure before subsequent layers are formed. Moreover, the one or more surfaces may be heated (e.g., using a heating tool, an oven, a thermal chamber, or another device) in between formation of layers of the coating 224 to decrease the drying or curing time and/or to otherwise reduce formation time for the layers. This reduces the time duration forming the coating 224, which reduces downtime of the lithography system 100. In some implementations, the one or more surfaces are heated to a temperature in a range of approximately 50 degrees Celsius to approximately 200 degrees Celsius to reduce formation times while minimizing damage to the coating 224 and/or to the components of the bottom module 138. However, other values for the temperature are within the scope of the present disclosure.

Alternatively, the coating 224 may be formed on one or more "new" components of the bottom module 138 (e.g., one or more components that have not been used in the lithography system 100 and/or are installed in the bottom module 138 for the first time). In these implementations, the lithography system 100 is transitioned to the disassembled configuration 704 to add the "new" component(s) to the bottom module 138 as replacement(s). In this way, the coating 224 may be formed on the one or more "new" components prior to a first use of the one or more "new" components in the lithography system 100 (with or without first performing the cleaning operation 706 on the one or more "new" components).

After the coating operation 708 is completed, the lithography system 100 may be transitioned from the disassembled configuration 704 to the assembled configuration 702, the lithography system 100 may be recalibrated, and the lithography system 100 may be placed back into operation with the coating 224 applied on the one or more surfaces of the one or more components of the bottom module 138.

The operations described in connection with FIGS. 7A-7C may be subsequently repeated to reapply the coating 224 to the one or more surfaces of the one or more components of the bottom module 138. In some implementations, the operations described in connection with FIGS. 7A-7C are repeated to reapply the coating 224 based on a maintenance schedule for the bottom module 138. In some implementations, the operations described in connection with FIGS. 7A-7C are repeated to reapply the coating 224 after a particular time duration (e.g., 1 year, 3 years, 10 years, and/or another time duration) from initially forming the coating 224 or from the last application of the coating 224. In some implementations, the operations described in connection with FIGS. 7A-7C are repeated to reapply the coating 224 based on an automated inspection of the coating 224 (e.g., using an image sensor and/or a controller). In these implementations, a device (e.g., the device 1100 of FIG. 11) may determine that the surface roughness of the coating 224 does not satisfy a surface roughness threshold, and may cause the coating 224 to be reapplied based on the determination.

In some implementations, a device (e.g., the device 1100 of FIG. 11) determines a time for reapplying the coating 224 using a machine learning model. In these implementations, the device uses the machine learning model to estimate the time reapplying the coating 224 by providing various parameters as input to the machine learning model, such as a thickness of the coating 224 that was applied (e.g., prior to reapplication of the coating 224), anticipated exposure types and/or anticipated exposure intensities for exposure operations of the lithography system 100, estimated operating temperatures for the exposure operations, and/or another parameter.

As indicated above, FIGS. 7A-7C are provided as one or more examples. Other examples may differ from what is described with regard to FIGS. 7A-7C.

Figure 8:
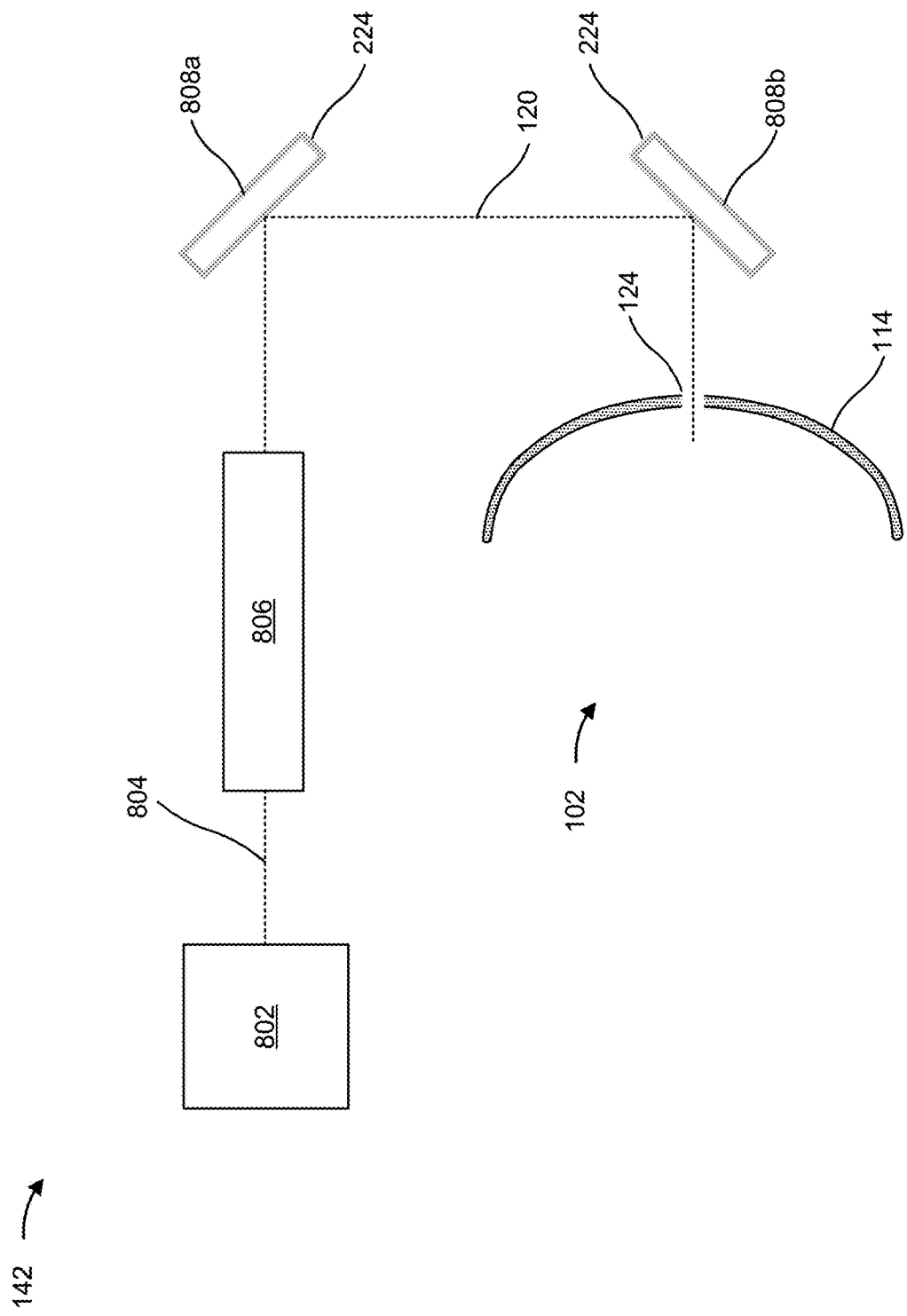
FIG. 8 is a diagram of an example laser source described herein for use in the lithography system of FIG. 1.

FIG. 8 is a diagram of an example laser source 142 described herein for use in the lithography system 100 of FIG. 1. The laser source 142 is configured to generate and provide the laser beam 120 to the radiation source 102 through the window 124 of the collector 114 for EUV radiation generation.

As shown in FIG. 8, the laser source 142 includes a drive laser 802. The drive laser 802 includes a semiconductor laser driver (e.g., a quantum dot laser driver, a diode laser driver), a resonator (or resonation chamber), an oscillator, a laser mode actuator or controller, and/or another component that is configured to generate a seed laser beam 804. The seed laser beam 804 is provided to an amplifier 806, which may include one or more laser amplifiers. The one or more laser amplifiers may include a preamplifier, a main amplifier, and/or another type of amplifier that is configured to amplify the seed laser beam 804 to form the laser beam 120. In some implementations, the laser source 142 includes one or more other components between the drive laser 802 and the amplifier 806, including one or more optical components that are configured to collimate the seed laser beam 804, select a particular wavelength for the seed laser beam 804, and/or adjust or modify other parameters of the seed laser beam 804. The laser beam 120 may be provided from the amplifier 806 to the radiation source 102 by one or more mirrors 808, including mirror 808a and mirror 808b, among other examples. In some implementations, the laser source 142 includes a greater or a fewer quantity of mirrors 808.

As further shown in FIG. 8, the coating 224 may be included on one or more surfaces of one or more components included in the laser source 142. As an example, the coating 224 may be included on one or more surfaces of the mirrors 808a and 808b (e.g., on one or more surfaces of the mirrors 808a and 808b that may be exposed or subjected to target material backsplash through the window 124 of the collector 114). The coating 224 may be included to protect against buildup and/or accumulation of the target material while maintaining sufficient reflectivity for the mirrors 808a and 808b. In some implementations, the coating 224 is included on other optical components included in the laser source 142. The coating 224 may include one or more of the coating materials described above in connection with FIGS. 2A-2C.

The coating 224 on the one or more surfaces of the mirrors 808a and 808b is configured to repel the target material and resist buildup of the target material on the one or more surfaces during an exposure operation of the lithography system 100. In particular, the coating 224 fills in low spots, scratches, and other types of imperfections in the one or more surfaces of the mirrors 808a and 808b. This reduces or decreases the surface roughness of the one or more surfaces of the mirrors 808a and 808b. The reduced surface roughness reduces the surface area on which the target material can build up and/or accumulate, which results in the resistance to the buildup and/or accumulation of the target material. The reduced surface roughness also provides reduced adhesion of the target material to the one or more surfaces of the mirrors 808a and 808b, which enables less abrasive cleaning techniques to be used to clean the one or more surfaces of the one or more surfaces of the mirrors 808a and 808b, which increases the operational life of the mirrors 808a and 808b, increases the life of the coating 224, and/or increases the time duration between reapplications of the coating 224 on the one or more surfaces of the mirrors 808a and 808b, among other examples. Moreover, the coating 224 may include a thermally insulating material and/or a material having a relatively high melting point that resists thermal damage to the one or more surfaces of the mirrors 808a and 808b (e.g., by reducing and/or resisting the transfer of heat to the one or more surfaces of the mirrors 808a and 808b).

As indicated above, FIG. 8 is provided as an example. Other examples may differ from what is described with regard to FIG. 8.

Figure 9A:
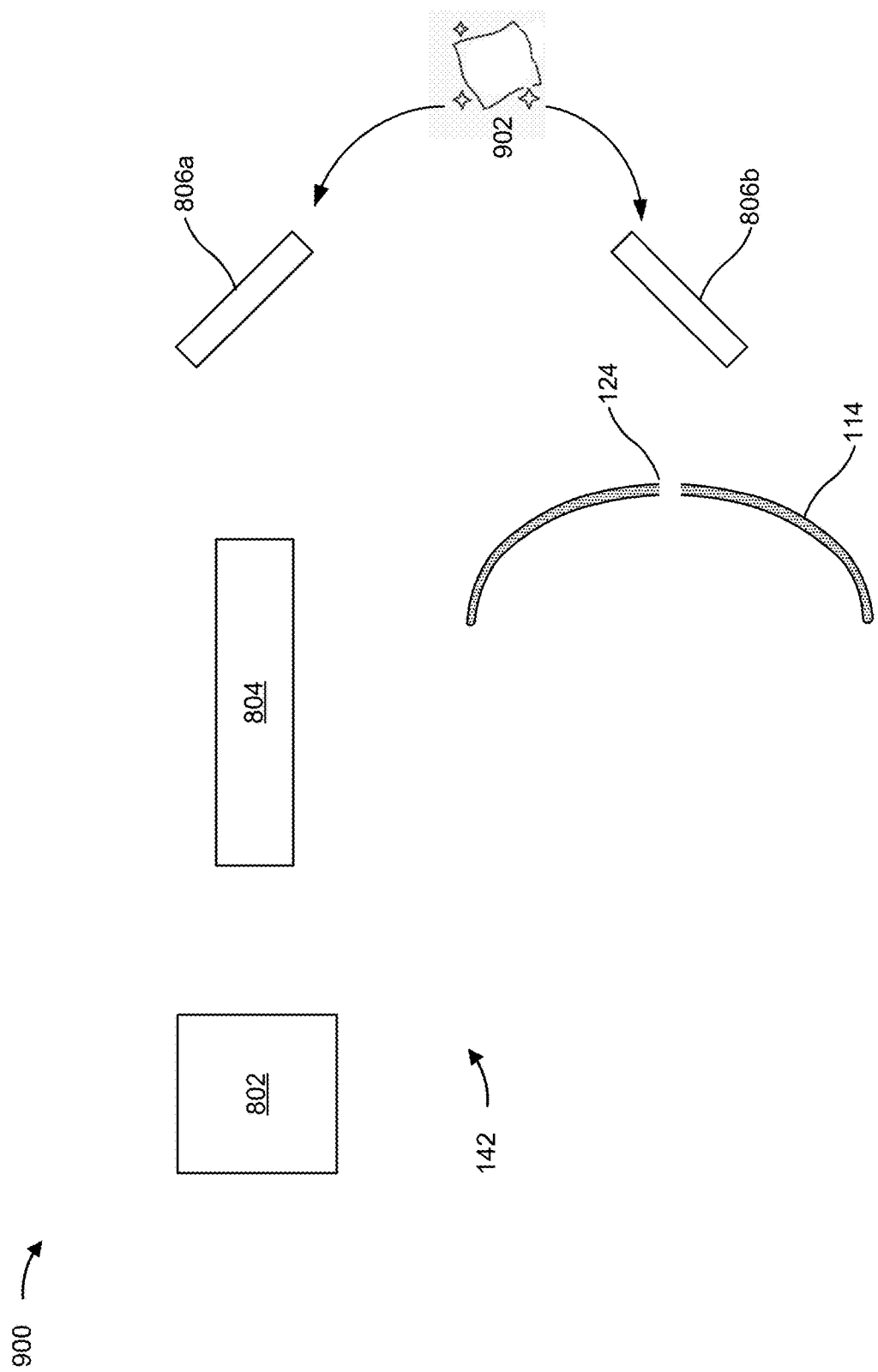
FIGS. 9A, 9B, and 10A-10D are diagrams of example implementations described herein.
Figure 9B:
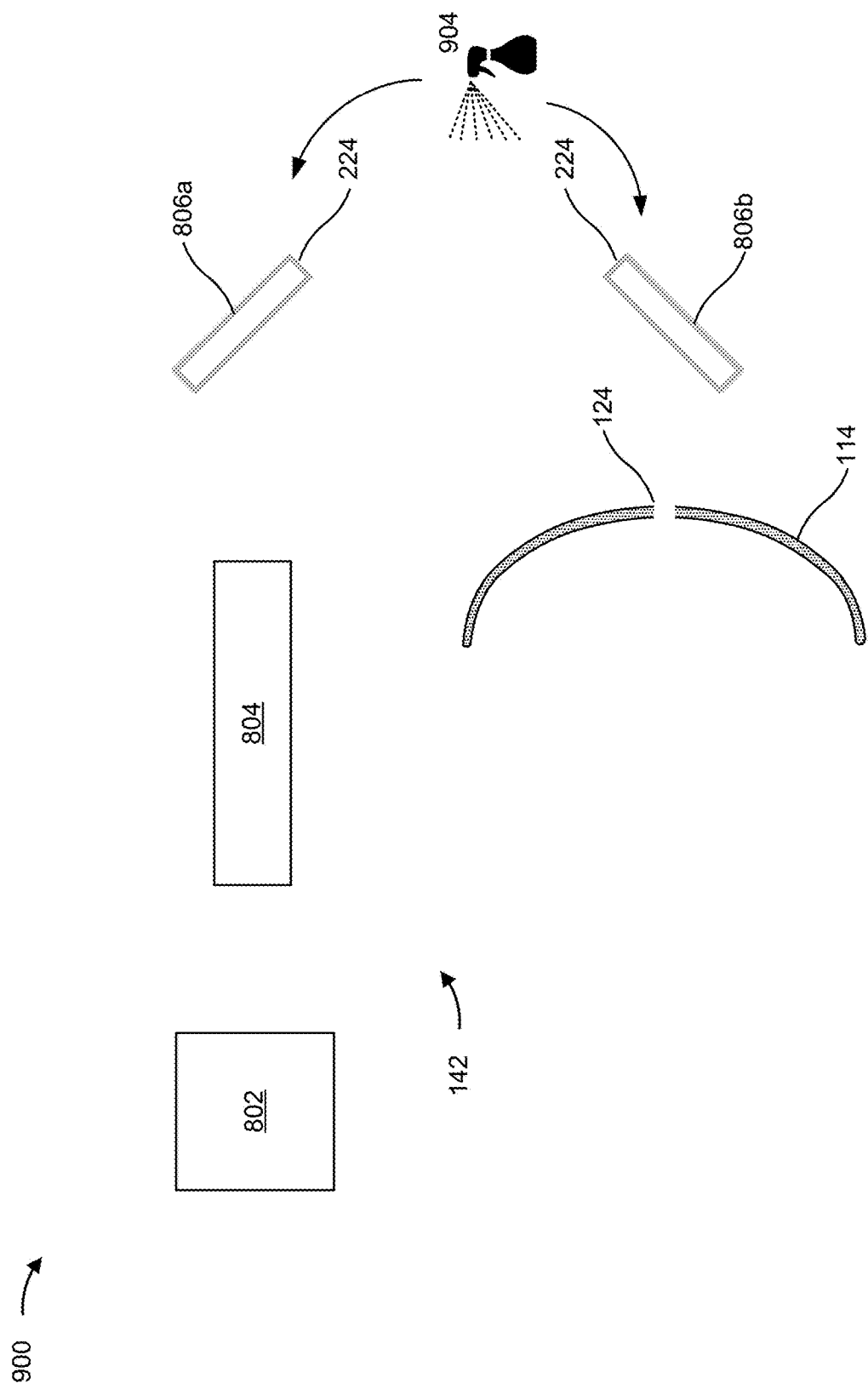

FIGS. 9A and 9B are diagrams of an example implementation 900 described herein. The example implementation 900 includes an example of forming the coating 224 on the one or more surfaces of the one or more components of the laser source 142. In particular, the example implementation 900 includes example of forming the coating 224 on the one or more surfaces of the mirrors 808a and 808b. However, the techniques described in connection with FIGS. 9A and 9B may be used to form the coating 224 on one or more surfaces of other components included in the laser source 142.

As shown in FIG. 9A, the laser source 142 is deactivated such that laser beam 120 is not provided to the radiation source 102. The laser source 142 may be deactivated to enable cleaning of one or more components of the laser source 142. For example, one or more surfaces of the mirrors 808a and 808b may be cleaned while the laser source 142 is deactivated. In some implementations, one or more components of the laser source 142 are cleaned at particular time intervals and/or based on a maintenance schedule. In some implementations, one or more components of the bottom module 138 are cleaned in preparation for forming the coating 224 on the one or more components.

As further shown in FIG. 9A, a cleaning operation 902 is performed for one or more components of the laser source 142. In some implementations, the cleaning operation 902 includes manual cleaning of the one or more components by maintenance personnel. In some implementations, the cleaning operation 902 includes an automated cleaning operation in which an automated cleaning tool is positioned to automatically clean the one or more components of the laser source 142 including the mirrors 808a and 808b. The cleaning operation 902 may include cleaning the mirrors 808a and 808b with cleaning towel, with one or more types of cleaning chemicals, and/or with one or more other types of cleaning tools.

As shown in FIG. 9B, the coating 224 is formed on one or more surfaces (e.g., one or more bare metal surfaces) of the one or more components of the laser source 142 in a coating operation 904 after the cleaning operation 902. In some implementations, the coating 224 is formed on the one or more surfaces while the one or more components are included in the laser source 142. In some implementations, the coating 224 is formed on the one or more surfaces while the one or more components are removed from the laser source 142.

In some implementations, the coating 224 is applied to the one or more surfaces of the one or more components using an applicator such as a cloth, a sponge, or another type of applicator. In some implementations, and as shown in the example in FIG. 9B, the coating 224 is applied to the one or more surfaces of the one or more components by spraying the coating 224 onto the one or more surfaces. In these implementations, the coating 224 may be sprayed onto the one or more surfaces using a spray bottle, a compressed air canister, a compressor and spraying device, or another type of spraying system. In some implementations, an automated sprayer system automatically sprays the coating 224 onto the one or more surfaces of the one or more components.

In some implementations, the coating 224 is formed to a thickness in a range of approximately 1 nanometer to a plurality of micrometers such that the coating 224 provides sufficient resistance to target material adhesion for the mirrors 808a and 808b, to provide sufficient resistance to thermal damage for the mirrors 808a and 808b, and/or to satisfy another performance parameter for the mirrors 808a and 808b. However, other values for the thickness of the coating 224 are within the scope of the present disclosure.

In some implementations, the coating 224 is applied in a single layer to the one or more surfaces of the one or more components of the laser source 142, and the coating 224 is permitted to dry, solidify, and/or cure before the lithography system is placed back into operation. The coating 224 may include a nanoscale coating (e.g., a coating having a single-layer thickness on the order of nanometers and less than one micrometer), a microscale coating (e.g., a coating having a single-layer thickness on the order of micrometers), or another type of coating. In some implementations, the coating 224 is left on the one or more surfaces for a particular time period (e.g., 1 minute, 3 minutes, or another time duration) before excess material of the coating 224 is removed.

In some implementations, the coating 224 is applied by forming a plurality of layers of the coating 224 on the one or more surfaces of the one or more components of the laser source 142. In these implementations, the layers of the coating 224 may be permitted to dry or cure before subsequent layers are formed. Moreover, the one or more surfaces may be heated (e.g., using a heating tool, an oven, a thermal chamber, or another device) in between formation of layers of the coating 224 to decrease the drying or curing time and/or to otherwise reduce formation time for the layers. This reduces the time duration forming the coating 224, which reduces downtime of the lithography system 100. In some implementations, the one or more surfaces are heated to a temperature in a range of approximately 50 degrees Celsius to approximately 200 degrees Celsius to reduce formation times while minimizing damage to the coating 224 and/or to the mirrors 808a and 808b. However, other values for the temperature are within the scope of the present disclosure.

Alternatively, the coating 224 may be formed on one or more "new" components of the laser source 142 (e.g., one or more of the mirrors 808a or 808b that have not been used in the lithography system 100 and/or are installed in the laser source 142 for the first time). In some implementations, the "new" component(s) are installed in the laser source 142 as replacement(s). In this way, the coating 224 may be formed on the one or more "new" components prior to a first use of the one or more "new" components in the laser source 142 (with or without first performing the cleaning operation 902 on the one or more "new" components).

After the coating operation 904 is completed, the laser source 142 may be activated and recalibrated, and the lithography system 100 may be placed back into operation with the coating 224 applied on the one or more surfaces of the one or more components of the laser source 142.

The operations described in connection with FIGS. 9A and 9B may be subsequently repeated to reapply the coating 224 to the one or more surfaces of the one or more components of the laser source 142. In some implementations, the operations described in connection with FIGS. 9A and 9B are repeated to reapply the coating 224 based on a maintenance schedule for the laser source 142. In some implementations, the operations described in connection with FIGS. 9A and 9B are repeated to reapply the coating 224 after a particular time duration (e.g., 1 year, 3 years, 10 years, and/or another time duration) from initially forming the coating 224 or from the last application of the coating 224. In some implementations, the operations described in connection with FIGS. 9A and 9B are repeated to reapply the coating 224 based on an automated inspection of the coating 224 (e.g., using an image sensor and/or a controller). In these implementations, a device (e.g., the device 1100 of FIG. 11) may determine that the surface roughness of the coating 224 does not satisfy a surface roughness threshold, and may cause the coating 224 to be reapplied based on the determination.

In some implementations, a device (e.g., the device 1100 of FIG. 11) determines a time for reapplying the coating 224 using a machine learning model. In these implementations, the device uses the machine learning model to estimate the time reapplying the coating 224 by providing various parameters as input to the machine learning model, such as a thickness of the coating 224 that was applied (e.g., prior to reapplication of the coating 224), the intensity of the laser beam 120, and/or anticipated exposure intensities for exposure operations of the lithography system 100, estimated operating temperatures for the exposure operations, and/or another parameter.

As indicated above, FIGS. 9A and 9B are provided as one or more examples. Other examples may differ from what is described with regard to FIGS. 9A and 9B.

FIGS. 10A-10D are diagrams of an example implementation 1000 described herein. The example implementation 1000 includes an example of forming the coating 224 on a surface 1002. The surface 1002 may correspond to one or more surfaces of the lithography system 100 described herein, such as one or more surfaces of the radiation source 102, one or more surfaces of the exposure tool 104 (or the bottom module 138 included in the exposure tool 104), and/or one or more surfaces included in the laser source 142, among other examples.

Figure 10A:
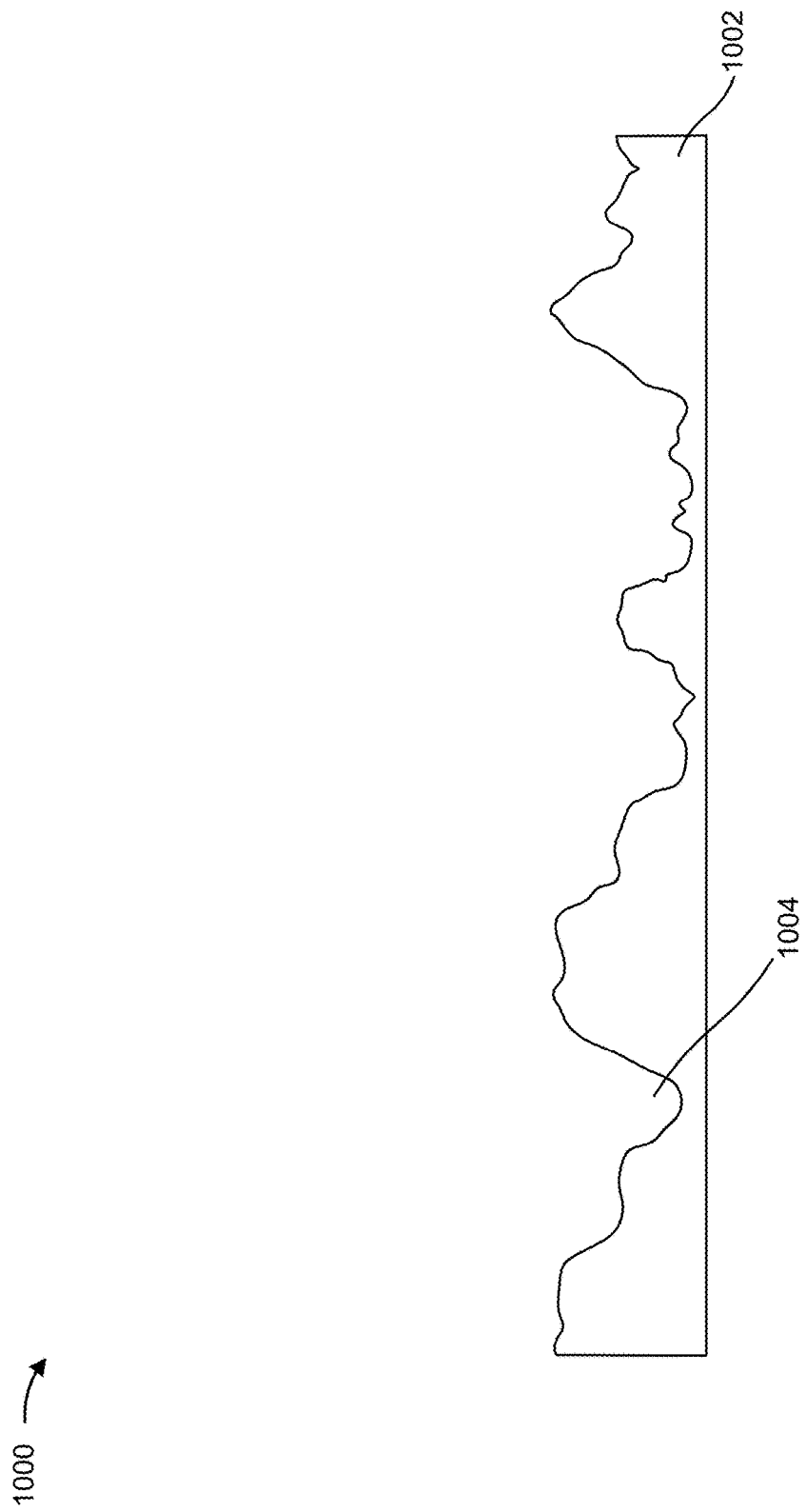

As shown in FIG. 10A, the surface 1002 includes imperfections 1004, which may include scratches, low spots, uneven portions, and/or other types of surface imperfections. The coating 224 may be formed on the surface 1002 to fill in the imperfections 1004 to smooth out the surface 1002, which increases the flatness of the surface 1002 and reduces the surface roughness of the surface 1002. This reduces adhesion of target material in the lithography system 100 to the surface 1002, as described herein.

Figure 10B:
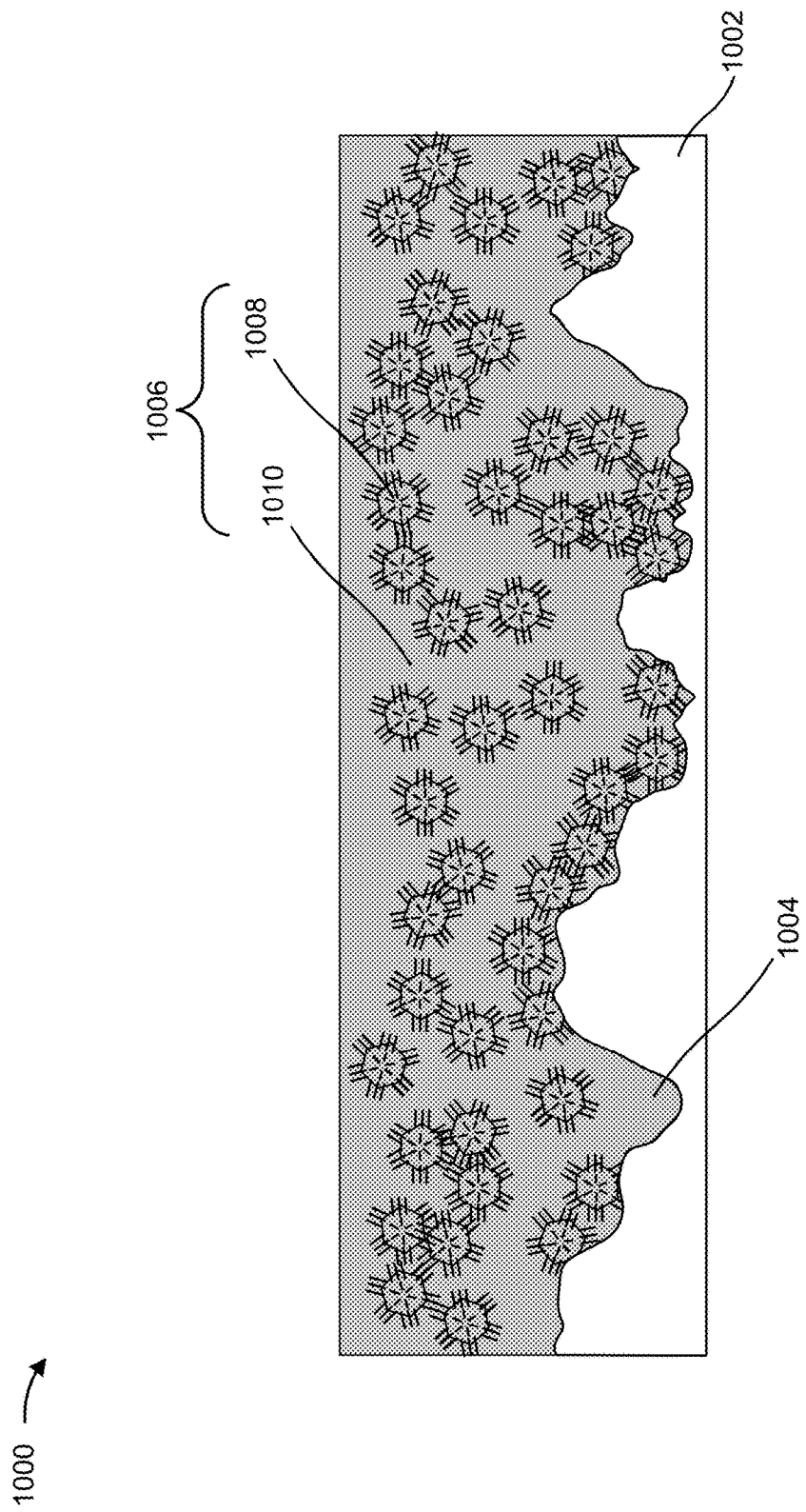

As shown in FIG. 10B, a compound 1006 is deposited onto the surface 1002. The compound 1006 may be dispensed onto the surface 1002 by a deposition tool or another type of tool. The compound 1006 includes a plurality of particles 1008 that are suspended in a solvent 1010. The solvent 1010 is configured to promote distribution of the particles 1008 along the surface 1002 and into the imperfections 1004. The solvent 1010 includes a liquid, a gel, or another liquid-containing fluid that is configured to evaporate over a time period, thereby leaving behind the particles 1008 on the surface 1002.

The particles 1008 include nanoscale particles (e.g., particles having a size that is on the order of nanometers, ranging from greater than 0 nanometers to less than 1 micrometer), microscale particles (e.g., particles having a size that is on the order of micrometers, ranging from greater than 0 micrometers to less than one millimeter), and/or particles of another size. The particles 1008 may include single-element particles (e.g., particles that include one type of elemental material) and/or molecule particles (e.g., particles that include two or more types of elemental materials). Examples of particles 1008 include nanoscale oxide particles (e.g., tantalum oxide ($Ta_xO_y$ such as $Ta_2O_5$), titanium oxide ($TiO_x$ such as $TiO_2$), silicon oxide ($SiO_x$ such as $SiO_2$ (quartz or silica)), aluminum oxide ($Al_xO_y$ such as $Al_2O_3$), hafnium oxide ($HfO_x$ such as $HfO_2$), zirconium oxide ($ZrO_x$ such as $ZrO_2$), and/or another type of nanoscale oxide particles), nanoscale nitride particles (e.g., silicon nitride ($Si_xN_y$ such as $Si_3N_4$) or another type of nanoscale nitride particles), nanoscale titanate particles (e.g., barium-strontium-titanate (BST) particles, lead-zirconium-titanate (PZT) particles, and/or another type of nanoscale titanate particles), nanoscale glass particles, nanoscale ceramic particles, nanoscale hydrophobic polymer particles (e.g., polytetrafluoroethylene (PTFE) and/or another type of nanoscale hydrophobic polymer), nanoscale acrylic particles, nanoscale amide particles, nanoscale imide particles, nanoscale dienes particles, nanoscale carbonate particles, nanoscale ester particles, nanoscale ether particles, nanoscale epichlorohydrin particles, nanoscale fluorocarbon particles, nanoscale silicate particles (e.g., a silicate [$SiO_{4-x}^{(4-2x)-}$]n where 0≤x<2, an orthosilicate [$SiO_4^{4-}$], a metasilicate [$SiO_3^{2-}$], a pyrosilicate [$Si_2O_7^{6-}$]n, a sodium metasilicate, a polymetric molecular silicate, a hexafluorosilicate, an inorganic silicate, and/or another type of nanoscale silicate), nanoscale fluorosilicate particles (e.g., particles including a combination of an organic fluorocarbon and an inorganic silicate), nanoscale cement particles, nanoscale waterglass particles (e.g., a compound containing sodium oxide ($Na_xO$) and silicon dioxide ($SiO_2$)), nanoscale silicon carbon particles, another type of nanoscale particle, and/or a combination thereof.

Figure 10C:
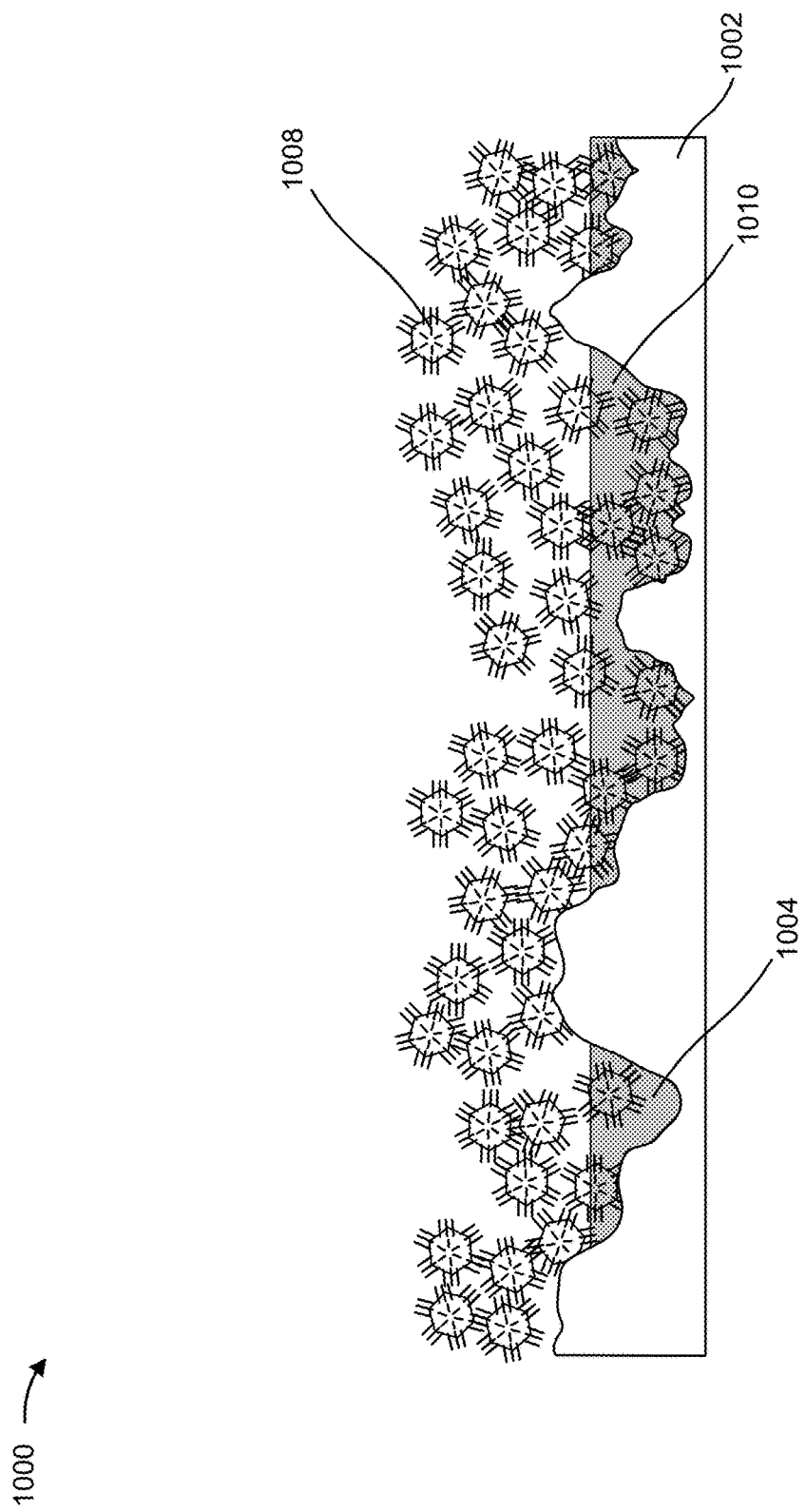

As shown in FIG. 10C, the particles 1008 bond with and/or to the surface 1002 as the solvent 1010 evaporates. The solvent 1010 may evaporate over a period of time (e.g., 10 minutes, 30 minutes, 1 hour), over which the particles 1008 continue to bond with and/or to the surface 1002.

Figure 10D:
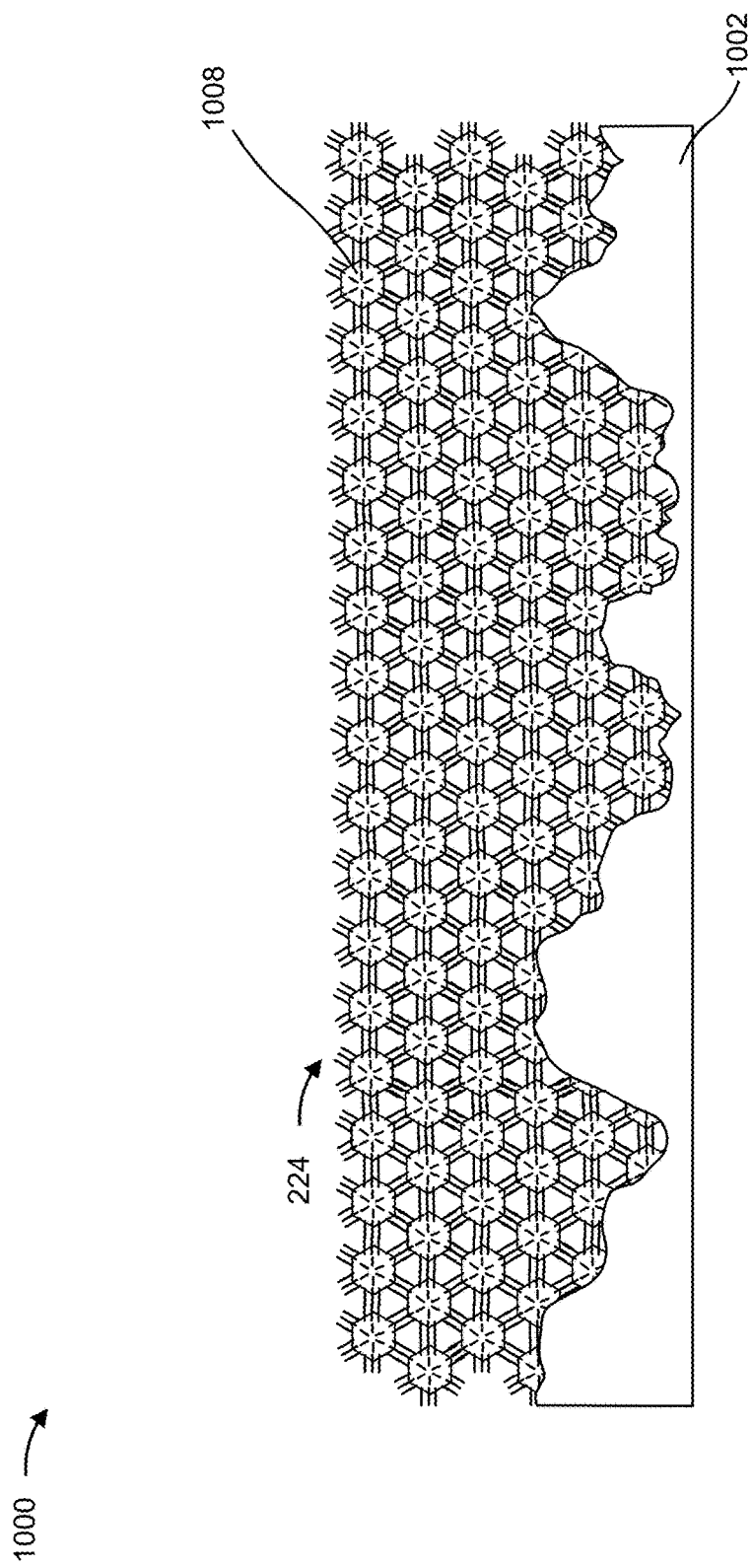

As shown in FIG. 10D, the particles 1008 may self-align into a substantially uniform structure as the particles 1008 solidify, harden, and/or cure to form the coating 224 on the surface 1002 (including in the imperfections 1004). The particles 1008 may self-align into a particular orientation such as a lattice configuration over a time period after the solvent evaporates (e.g., 30 minutes, 1 hour, 24 hours). The particles 1008 fill in the imperfections 1004, which results in a substantially flat and smooth surface for the surface 1002. The substantially flat and smooth surface for the surface 1002 provided by the coating 224 is configured to reduce adhesion of target material particles (e.g., tin (Sn) particles and/or another type of target material particles) to the surface 1002 (e.g., during an exposure operation of the lithography system 100), is configured to repel target material particles from the surface 1002, is configured to resist buildup of target material particles (e.g., during an exposure operation of the lithography system 100), is configured to provide resistance against oxidation of the surface 1002, is configured to resist thermal damage to the surface 1002 (e.g., during an exposure operation of the lithography system 100), and/or is configured to enable the lithography system 100 to operate at higher operating temperatures (e.g., relative to without the coating 224), among other examples. Moreover, the coating 224 may be water repellent, may resist smudging of the surface 1002, and/or may repel dirt and/or oil from the surface 1002, among other examples.

As indicated above, FIGS. 10A-10D are provided as one or more examples. Other examples may differ from what is described with regard to FIGS. 10A-10D.

Figure 11:
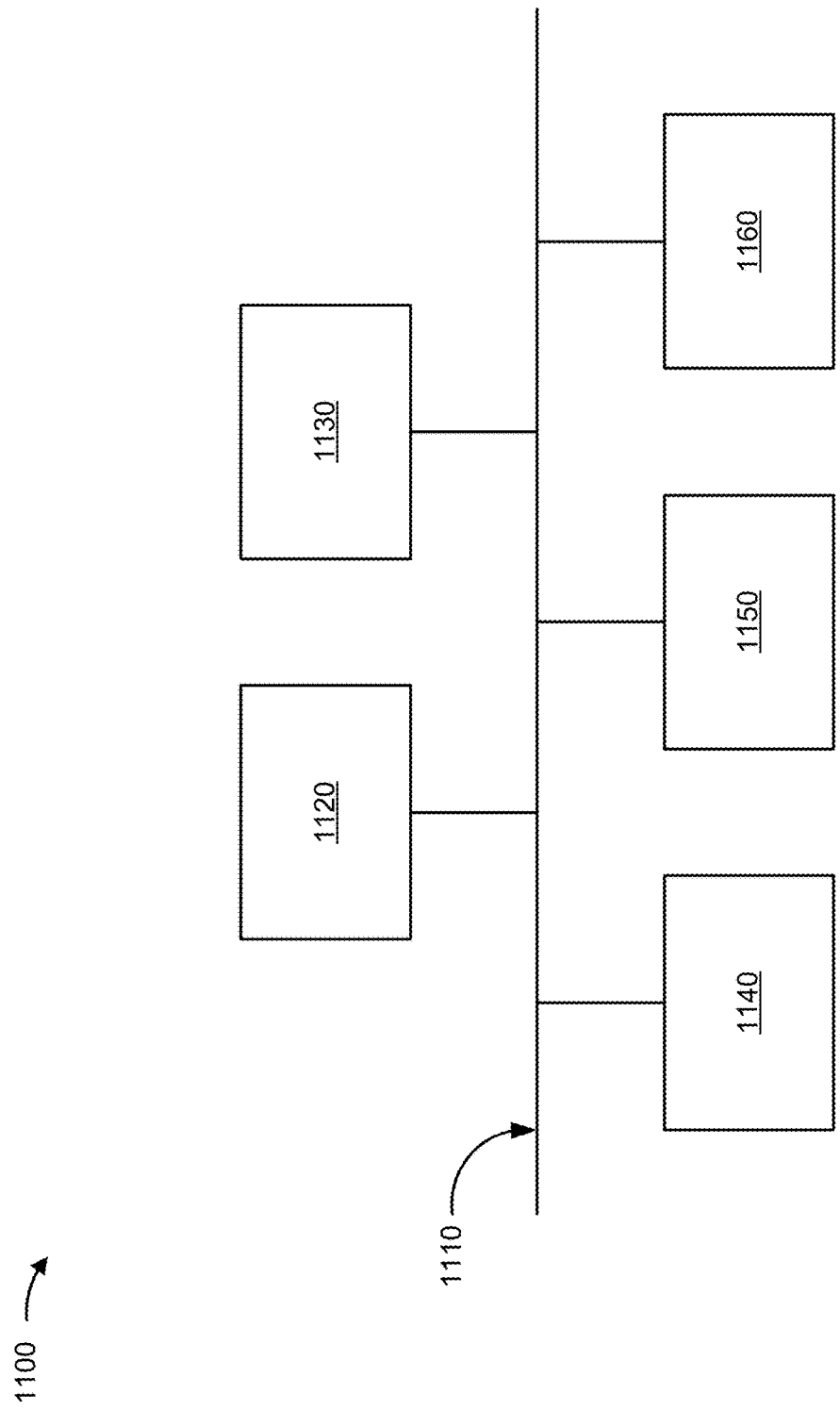
FIG. 11 is a diagram of example components of one or more devices of FIG. 1 described herein.

FIG. 11 is a diagram of example components of a device 1100. In some implementations, one or more devices and/or components of the radiation source 102, one or more devices and/or components of the exposure tool 104, and/or one or more devices and/or components of the laser source 142 may include one or more devices 1100 and/or one or more components of device 1100. As shown in FIG. 11, device 1100 may include a bus 1110, a processor 1120, a memory 1130, an input component 1140, an output component 1150, and a communication component 1160.

Bus 1110 includes one or more components that enable wired and/or wireless communication among the components of device 1100. Bus 1110 may couple together two or more components of FIG. 11, such as via operative coupling, communicative coupling, electronic coupling, and/or electric coupling. Processor 1120 includes a central processing unit, a graphics processing unit, a microprocessor, a controller, a microcontroller, a digital signal processor, a field-programmable gate array, an application-specific integrated circuit, and/or another type of processing component. Processor 1120 is implemented in hardware, firmware, or a combination of hardware and software. In some implementations, processor 1120 includes one or more processors capable of being programmed to perform one or more operations or processes described elsewhere herein.

Memory 1130 includes volatile and/or nonvolatile memory. For example, memory 1130 may include random access memory (RAM), read only memory (ROM), a hard disk drive, and/or another type of memory (e.g., a flash memory, a magnetic memory, and/or an optical memory). Memory 1130 may include internal memory (e.g., RAM, ROM, or a hard disk drive) and/or removable memory (e.g., removable via a universal serial bus connection). Memory 1130 may be a non-transitory computer-readable medium. Memory 1130 stores information, instructions, and/or software (e.g., one or more software applications) related to the operation of device 1100. In some implementations, memory 1130 includes one or more memories that are coupled to one or more processors (e.g., processor 1120), such as via bus 1110.

Input component 1140 enables device 1100 to receive input, such as user input and/or sensed input. For example, input component 1140 may include a touch screen, a keyboard, a keypad, a mouse, a button, a microphone, a switch, a sensor, a global positioning system sensor, an accelerometer, a gyroscope, and/or an actuator. Output component 1150 enables device 1100 to provide output, such as via a display, a speaker, and/or a light-emitting diode. Communication component 1160 enables device 1100 to communicate with other devices via a wired connection and/or a wireless connection. For example, communication component 1160 may include a receiver, a transmitter, a transceiver, a modem, a network interface card, and/or an antenna.

Device 1100 may perform one or more operations or processes described herein. For example, a non-transitory computer-readable medium (e.g., memory 1130) may store a set of instructions (e.g., one or more instructions or code) for execution by processor 1120. Processor 1120 may execute the set of instructions to perform one or more operations or processes described herein. In some implementations, execution of the set of instructions, by one or more processors 1120, causes the one or more processors 1120 and/or the device 1100 to perform one or more operations or processes described herein. In some implementations, hardwired circuitry may be used instead of or in combination with the instructions to perform one or more operations or processes described herein. Additionally, or alternatively, processor 1120 may be configured to perform one or more operations or processes described herein. Thus, implementations described herein are not limited to any specific combination of hardware circuitry and software.

The number and arrangement of components shown in FIG. 11 are provided as an example. Device 1100 may include additional components, fewer components, different components, or differently arranged components than those shown in FIG. 11. Additionally, or alternatively, a set of components (e.g., one or more components) of device 1100 may perform one or more functions described as being performed by another set of components of device 1100.

Figure 12:
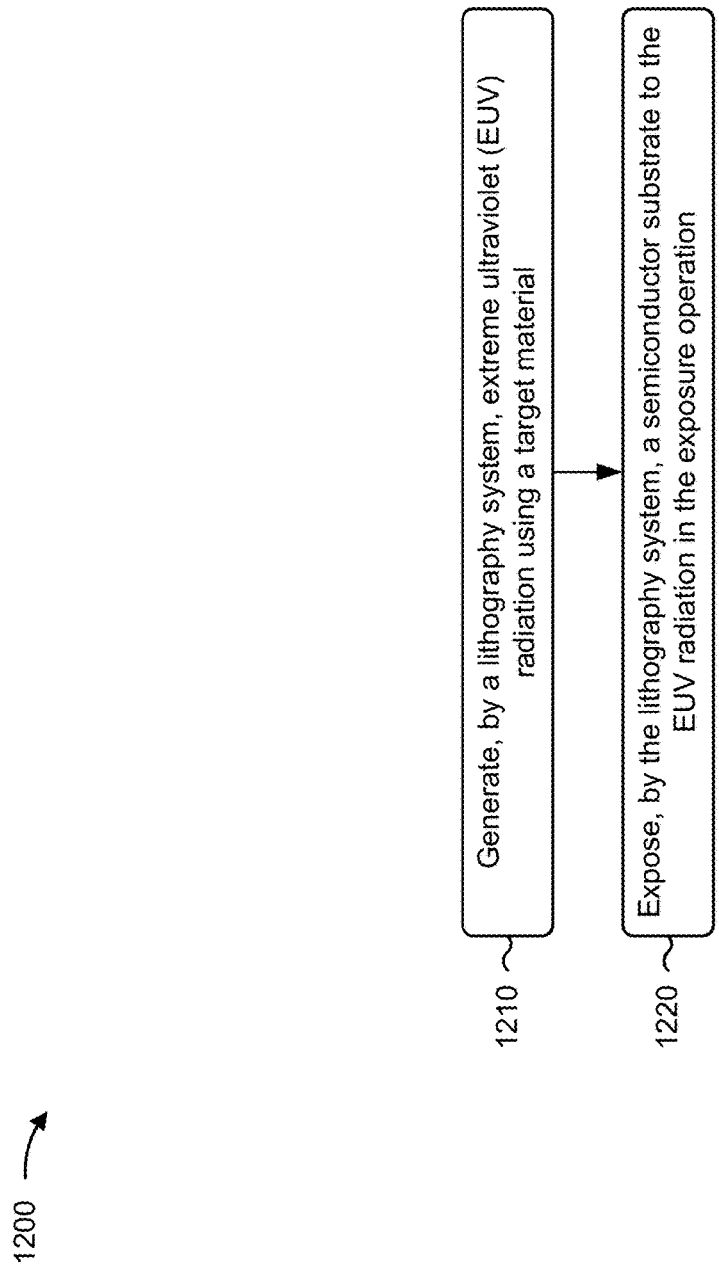
FIG. 12 is a flowchart of example process relating to performing an exposure operation described herein.

FIG. 12 is a flowchart of an example process 1200 associated with performing an exposure operation described herein. In some implementations, one or more process blocks of FIG. 12 may be performed by a lithography system 100 (e.g., lithography system 100). In some implementations, one or more process blocks of FIG. 12 may be performed by another device or a group of devices separate from or including the lithography system 100, such as a radiation source (e.g., the radiation source 102), an exposure tool (e.g., the exposure tool 104, and/or a laser source (e.g., the laser source 142). Additionally, or alternatively, one or more process blocks of FIG. 12 may be performed by one or more components of device 1100, such as processor 1120, memory 1130, input component 1140, output component 1150, and/or communication component 1160.

As shown in FIG. 12, process 1200 may include generating EUV radiation using a target material (block 1210). For example, the lithography system 100 (e.g., using the radiation source 102 and/or the laser source 142) may generate EUV radiation (e.g., the radiation 106) using a target material (e.g., droplets 118), as described above. In some implementations, a protective coating (e.g., the coating 224), on one or more surfaces of the lithography system 100 that are exposed to the target material during an exposure operation of the lithography system 100, resists buildup of the target material on the one or more surfaces during the exposure operation. In some aspects, the protective coating (e.g., the coating 224) includes a plurality of nanoscale particles.

As further shown in FIG. 12, process 1200 may include exposing a semiconductor substrate to the EUV radiation in the exposure operation (block 1220). For example, the lithography system 100 may (e.g., using the exposure tool 104) expose the semiconductor substrate 110 to the EUV radiation in the exposure operation, as described above.

Process 1200 may include additional implementations, such as any single implementation or any combination of implementations described below and/or in connection with one or more other processes described elsewhere herein.

In a first implementation, the protective coating (e.g., the coating 224) includes at least one of a glass coating, a ceramic coating, a polytetrafluoroethylene (PTFE), a hydrophobic polymer coating, a quartz coating, a silicate coating, a silica coating, a cement coating, or a fluorosilicate coating. In a second implementation, alone or in combination with the first implementation, the target material includes tin (Sn), and the protective coating (e.g., the coating 224) promotes drainage of the tin along interior surfaces in a vessel 112 of an EUV source included in the lithography system 100 and to a drain line 212*b* included in the EUV source in the exposure operation.

In a third implementation, alone or in combination with one or more of the first and second implementations, the protective coating (e.g., the coating 224) resists thermal damage to the one or more surfaces during the exposure operation. In a fourth implementation, alone or in combination with one or more of the first through third implementations, the protective coating (e.g., the coating 224) provides resistance against oxidation for the one or more surfaces.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

Figure 13:
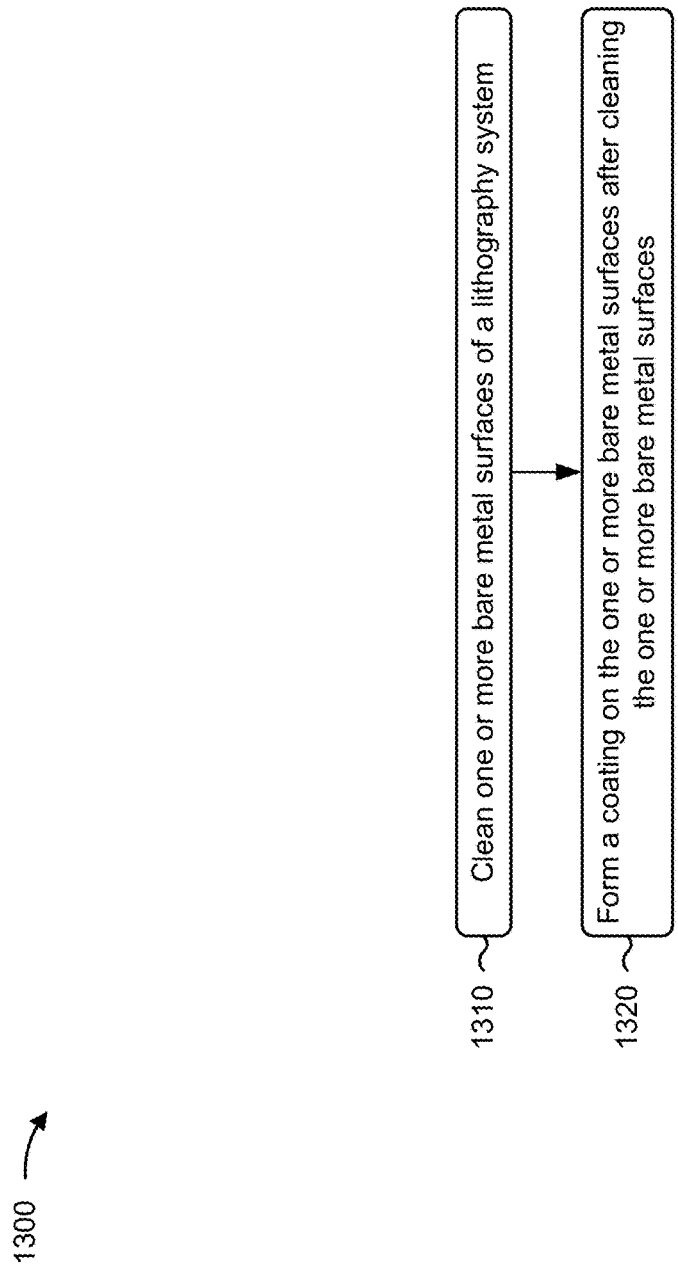
FIG. 13 is a flowchart of example process relating to forming a coating on one or more surfaces of a lithography system described herein.

FIG. 13 is a flowchart of an example process 1300 associated with forming a coating on one or more surfaces of a lithography system described herein. In some implementations, one or more process blocks of FIG. 13 may be performed by on or more cleaning tools, one or more coating tools, and/or one or more other tools. Additionally, or alternatively, one or more process blocks of FIG. 13 may be performed by one or more components of device 1100, such as processor 1120, memory 1130, input component 1140, output component 1150, and/or communication component 1160.

As shown in FIG. 13, process 1300 may include cleaning one or more bare metal surfaces of a lithography system (block 1310). For example, one or more bare metal surfaces of the lithography system 100 may be cleaned in the physical cleaning operation 302, the chemical cleaning operation 304, the cleaning operation 706, the cleaning operation 902, and/or another cleaning operation, as described above. In some implementations, the one or more bare metal surfaces are included in at least one of the vessel 112 included in the radiation source 102 (e.g., an EUV source) of the lithography system 100, the exposure tool 104 (e.g., an EUV exposure tool) of the lithography system 100, or the laser source 142 of the lithography system 100.

As further shown in FIG. 13, process 1300 may include forming a coating on the one or more bare metal surfaces after cleaning the one or more bare metal surfaces (block 1320). For example, the coating 224 may be formed on the one or more bare metal surfaces after cleaning the one or more bare metal surfaces, as described above. In some implementations, the coating 224 is configured to reduce adhesion of target material particles (e.g., associated with the droplets 118) to the one or more bare metal surfaces during operation of the lithography system 100.

Process 1300 may include additional implementations, such as any single implementation or any combination of implementations described below and/or in connection with one or more other processes described elsewhere herein.

In a first implementation, forming the coating 224 includes forming a nanoscale coating on the one or more bare metal surfaces, where the nanoscale coating includes a plurality of nanoscale particles (e.g., the particles 1008). In a second implementation, alone or in combination with the first implementation, the plurality of nanoscale particles (e.g., the particles 1008) include an inorganic silicate and an organic fluorocarbon. In a third implementation, alone or in combination with one or more of the first and second implementations, forming the nanoscale coating (e.g., the coating 224) includes depositing the compound 1006, that includes the plurality of nanoscale particles (e.g., the particles 1008) suspended in the solvent 1010, onto the one or more bare metal surfaces (e.g., the surfaces 1002), where the plurality of nanoscale particles bond to the one or more bare metal surfaces as the solvent evaporates, and where the plurality of nanoscale particles self-align into a lattice configuration over a time period after the solvent evaporates.

In a fourth implementation, alone or in combination with one or more of the first through third implementations, the coating 224 reduces a surface roughness of the one or more bare metal surfaces, and where the coating 224 is configured to prevent surface oxidization of the one or more bare metal surfaces. In a fifth implementation, alone or in combination with one or more of the first through fourth implementations, forming the coating 224 on the one or more bare metal surfaces includes forming the coating on at least one of the IF cap 202 included in the vessel 112, the scrubber system 204 included in the vessel 112, a plurality of vanes 218 included in the vessel 112, a drain hole 212*a* surface included in the EUV source, a drain line 212*b* included in the EUV source, one or more mirrors 806*a*, 806*b* included in the laser source 142, a reticle stage 140 included in the EUV exposure tool, or a wafer stage 136 included in the EUV exposure tool.

In a sixth implementation, alone or in combination with one or more of the first through fifth implementations, forming the coating 224 on the one or more bare metal surfaces includes spraying the coating 224 on a subset of the one or more bare metal surfaces of the EUV source while the collector 114 is installed in the EUV source. In a seventh implementation, alone or in combination with one or more of the first through sixth implementations, forming the coating 224 on the one or more bare metal surfaces includes forming a plurality of layers of the coating on the one or more bare metal surfaces, and heating the one or more bare metal surfaces in between forming at least a subset of the plurality of layers to reduce a formation time for the subset of the plurality of layers.

In an eighth implementation, alone or in combination with one or more of the first through seventh implementations, heating the one or more bare metal surfaces includes heating the one or more bare metal surfaces to a temperature in a range of approximately 50 degrees Celsius to approximately 200 degrees Celsius. In a ninth implementation, alone or in combination with one or more of the first through eighth implementations, forming the coating 224 on the one or more bare metal surfaces includes forming the coating 224 to fill in low spots (e.g., imperfections 1004) in the one or more bare metal surfaces to reduce imperfections in the one or more bare metal surfaces.

In a tenth implementation, alone or in combination with one or more of the first through ninth implementations, process 1300 includes reapplying the coating 224 after a particular time duration of operation of the lithography system 100. In an eleventh implementation, alone or in combination with one or more of the first through tenth implementations, process 1300 includes removing a collector 114 from the EUV source, where cleaning the one or more bare metal surfaces includes performing, after removing the collector 114, a physical cleaning operation 302 to remove target material from a subset of the one or more bare metal surfaces included in the EUV source, and performing, after performing the physical cleaning operation 302, a chemical cleaning operation 304 to remove loose target material debris from the subset of the one or more bare metal surfaces, where the loose target material debris results from the physical cleaning operation 302, and where forming the coating 224 on the one or more bare metal surfaces includes at least one of applying the coating 224 to the subset of the one or more bare metal surfaces using an applicator (e.g., the coating operation 306), or spraying (e.g., the coating operation 402, the coating operation 502) the coating 224 onto the subset of the one or more bare metal surfaces.

Although FIG. 13 shows example blocks of process 1300, in some implementations, process 1300 may include additional blocks, fewer blocks, different blocks, or differently arranged blocks than those depicted in FIG. 13. Additionally, or alternatively, two or more of the blocks of process 1300 may be performed in parallel.

In this way, a coating is included on one or more components of a lithography system such as an EUV lithography system. The coating includes a nanoscale coating or another type of coating that is formed on one or more surfaces (e.g., one or more bare metal surfaces, one or more mirror surfaces, and/or another type of surface) of the one or more components. The coating reduces surface roughness of the one or more surfaces, increases flatness of the one or more surfaces, and/or increases uniformity of the one or more surfaces. The coating may be formed on the one or more surfaces using one or more of the techniques described herein. In this way, the coating is configured to reduce adhesion of target material particles (e.g., tin (Sn) particles and/or another type of target material particles) to the one or more surfaces, is configured to resist buildup of target material particles on the one or more surfaces, is configured to provide resistance against oxidation of the one or more surfaces, is configured to resist thermal damage of the one or more surfaces, and/or is configured to enable the lithography system to operate at higher operating temperatures (e.g., relative to without the coating), among other examples.

As described in greater detail above, some implementations described herein provide a method. The method includes generating, by a lithography system, EUV radiation using a target material, where a protective coating, on one or more surfaces of the lithography system that are exposed to the target material during an exposure operation of the lithography system, includes a plurality of nanoscale particles. The method includes exposing, by the lithography system, a semiconductor substrate to the EUV radiation in the exposure operation.

As described in greater detail above, some implementations described herein provide a method. The method includes cleaning one or more bare metal surfaces of a lithography system, where the one or more bare metal surfaces are included in at least one of a vessel included in an EUV source of a lithography system, an EUV exposure tool of the lithography system, or a laser source of the lithography system. The method includes forming a coating on the one or more bare metal surfaces after cleaning the one or more bare metal surfaces, where the coating is configured to reduce adhesion of target material particles to the one or more bare metal surfaces during operation of the lithography system.

As described in greater detail above, some implementations described herein provide a lithography system. The lithography system includes a laser source configured to generate a laser beam. The lithography system includes a radiation source configured to generate radiation using the laser beam and a target material. The lithography system includes an exposure tool configured to transfer a pattern from a reticle to a semiconductor substrate using the radiation. The lithography system includes a coating on one or more surfaces of at least one of the laser source, the radiation source, or the exposure tool, where the coating is configured to repel the target material from the one or more surfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   generating, by a lithography system, extreme ultraviolet (EUV) radiation using a target material,
      wherein a protective coating, on one or more surfaces of the lithography system that are exposed to the target material during an exposure operation of the lithography system, comprises a plurality of nanoscale particles,
      wherein the plurality of nanoscale particles are self-aligned in a uniform configuration,
      wherein at least a subset of the plurality of nanoscale particles fills in one or more imperfections on the one or more surfaces, and
      wherein the one or more surfaces including the protective coating are substantially flat; and
   exposing, by the lithography system, a semiconductor substrate to the EUV radiation in the exposure operation.

2. The method of claim 1, wherein the protective coating comprises at least one of:
   a glass coating,
   a ceramic coating,
   a polytetrafluoroethylene (PTFE),
   a hydrophobic polymer coating,
   a quartz coating,
   a silicate coating,
   a silica coating,
   a cement coating, or
   a fluorosilicate coating.

3. The method of claim 1, wherein the target material includes tin (Sn); and
   wherein the tin is drained along interior surfaces in a vessel of an EUV source included in the lithography system from the one or more surfaces that are substantially flat to a drain line included in the EUV source in the exposure operation.

4. The method of claim 1, wherein the protective coating resists thermal damage to the one or more surfaces during the exposure operation.

5. The method of claim 1, wherein the protective coating provides resistance against oxidation for the one or more surfaces.

6. A method, comprising:
   cleaning one or more bare metal surfaces of a lithography system,
      wherein the one or more bare metal surfaces are included in at least one of:
         a vessel included in an extreme ultraviolet (EUV) source of a lithography system,
         an EUV exposure tool of the lithography system, or
         a laser source of the lithography system; and forming a coating on the one or more bare metal surfaces after cleaning the one or more bare metal surfaces,
wherein forming the coating on the one or more bare metal surfaces comprises:
depositing a compound that includes a plurality of particles suspended in a solvent onto the one or more bare metal surfaces,
wherein the plurality of particles bond to one or more imperfections on the one or more bare metal surfaces as the solvent evaporates, and
wherein the plurality of particles self-align into a lattice configuration.

7. The method of claim 6,
wherein the plurality of particles includes a plurality of nanoscale particles.

8. The method of claim 7, wherein the plurality of nanoscale particles include an inorganic silicate and an organic fluorocarbon.

9. The method of claim 7,
wherein the plurality of nanoscale particles self-align into the lattice configuration over a time period after the solvent evaporates.

10. The method of claim 6, wherein the coating reduces a surface roughness of the one or more bare metal surfaces; and
wherein the coating is configured to prevent surface oxidization of the one or more bare metal surfaces.

11. The method of claim 6, wherein
the coating is formed on at least one of:
an intermediate focus (IF) cap included in the vessel,
a scrubber system included in the vessel,
a plurality of vanes included in the vessel,
a drain hole included in the EUV source,
a drain line included in the EUV source,
one or more mirrors included in the laser source,
a reticle stage included in the EUV exposure tool, or
a wafer stage included in the EUV exposure tool.

12. The method of claim 6, further comprising:
removing a collector from the EUV source;
wherein cleaning the one or more bare metal surfaces comprises:
performing, after removing the collector, a physical cleaning operation to remove target material from a subset of the one or more bare metal surfaces included in the EUV source, and
performing, after performing the physical cleaning operation, a chemical cleaning operation to remove loose target material debris from the subset of the one or more bare metal surfaces,
wherein the loose target material debris results from the physical cleaning operation; and
wherein forming the coating on the one or more bare metal surfaces comprises at least one of:
applying the coating to the subset of the one or more bare metal surfaces using an applicator, or
spraying the coating onto the subset of the one or more bare metal surfaces.

13. The method of claim 6, wherein forming the coating on the one or more bare metal surfaces comprises:
spraying the coating on a subset of the one or more bare metal surfaces of the EUV source while a collector is installed in the EUV source.

14. The method of claim 6, wherein forming the coating on the one or more bare metal surfaces comprises:
forming a plurality of layers of the coating on the one or more bare metal surfaces; and
heating the one or more bare metal surfaces in between forming at least a subset of the plurality of layers to reduce a formation time for the subset of the plurality of layers.

15. The method of claim 14, wherein heating the one or more bare metal surfaces comprises:
heating the one or more bare metal surfaces to a temperature in a range of approximately 50 degrees Celsius to approximately 200 degrees Celsius.

16. The method of claim 6, wherein
forming the coating to fill in the one or more imperfections comprise one or more low spots in the one or more bare metal surfaces, and
wherein the coating fills in the one or more low spots.

17. The method of claim 6, further comprising:
reapplying the coating after a particular time duration of operation of the lithography system.

18. A lithography system, comprising:
a laser source configured to generate a laser beam;
a radiation source configured to generate radiation using the laser beam and a target material;
an exposure tool configured to transfer a pattern from a reticle to a semiconductor substrate using the radiation; and
a coating on one or more surfaces of at least one of the laser source, the radiation source, or the exposure tool,
wherein the coating is configured to repel the target material from the one or more surfaces,
wherein the coating includes a plurality of particles that are self-aligned in a uniform configuration,
wherein at least a subset of the plurality of particles occupies one or more imperfections on the one or more surfaces, and
wherein the one or more surfaces including the coating are substantially flat.

19. The lithography system of claim 18, wherein the one or more surfaces comprise at least one of:
one or more surfaces of one or more mirrors included in the laser source,
one or more surfaces in a vessel of the radiation source,
one or more surfaces of a wafer stage in the exposure tool, or
one or more surfaces of a reticle stage in the exposure tool.

20. The lithography system of claim 18, wherein the coating comprises at least one of:
a nanoscale oxide coating,
a coating that includes a compound containing sodium oxide ($Na_xO$) and silicon dioxide ($SiO_2$), or
a dielectric thin film coating.

* * * * *